US00RE38054E

(19) United States
(12) Reissued Patent
Hofmann et al.

(10) Patent Number: US RE38,054 E
(45) Date of Reissued Patent: Apr. 1, 2003

(54) RELIABLE, MODULAR, PRODUCTION QUALITY NARROW-BAND HIGH REP RATE $F_2$ LASER

(75) Inventors: Thomas Hofmann, San Diego, CA (US); Jean-Marc Hueber, La Jolla, CA (US); Palash P. Das, Vista, CA (US); Toshihiko Ishihara, San Diego, CA (US); Thomas P. Duffey, San Diego, CA (US); John T. Melchior, San Diego, CA (US); Herve A. Besaucele, San Diego, CA (US); Richard G. Morton, San Diego, CA (US); Richard M. Ness, San Diego, CA (US); Peter C. Newman, San Diego, CA (US); William N. Partlo, Poway, CA (US); Daniel A. Rothweil, Poway, CA (US); Richard L. Sandstrom, Encinitas, CA (US)

(73) Assignee: Cymer, Inc., San Diego, CA (US)

(21) Appl. No.: 09/801,383

(22) Filed: Mar. 7, 2001

Related U.S. Patent Documents

Reissue of:
(64) Patent No.: 6,018,537
Issued: Jan. 25, 2000
Appl. No.: 09/273,446
Filed: Mar. 19, 1999

U.S. Applications:

(63) Continuation-in-part of application No. 09/271,041, filed on Mar. 17, 1999, and application No. 08/995,832, filed on Dec. 22, 1997, and application No. 08/947,474, filed on Oct. 10, 1997, and application No. 08/939,611, filed on Sep. 29, 1997, and application No. 08/896,384, filed on Jul. 18, 1997, and application No. 09/217,340, filed on Dec. 21, 1998, and application No. 09/211,825, filed on Dec. 15, 1998, and application No. 09/206,526, filed on Dec. 7, 1998, and application No. 09/165,593, filed on Oct. 2, 1998, and application No. 09/162,341, filed on Sep. 28, 1998, and application No. 09/157,067, filed on Sep. 18, 1998, and application No. 09/082,139, filed on May 20, 1998, and application No. 09/041,474, filed on Mar. 11, 1998, and application No. 09/034,870, filed on Mar. 4, 1998.

(51) Int. Cl.[7] ..... H01S 3/10
(52) U.S. Cl. ..... 372/25; 372/38.04; 372/92; 372/58; 372/86; 372/87; 372/102; 372/34; 372/82; 372/37; 372/60; 372/38.05
(58) Field of Search ..... 372/25, 92, 38, 372/70, 69, 58, 86, 87, 102, 34, 82, 37, 60, 33

(56) References Cited

U.S. PATENT DOCUMENTS

| | | | | |
|---|---|---|---|---|
| 4,488,311 A | | 12/1984 | Davis et al. | 372/89 |
| 4,959,840 A | | 9/1990 | Akins et al. | 372/57 |
| 5,463,650 A | | 10/1995 | Ito et al. | 372/57 |
| 5,856,991 A | * | 1/1999 | Ershov | 372/25 |

* cited by examiner

*Primary Examiner*—Leon Scott, Jr.
(74) *Attorney, Agent, or Firm*—John R. Ross

(57) ABSTRACT

The present invention provides a reliable modular production quality excimer laser capable of producing 10 mJ laser pulses in the range of 1000 Hz to 2000 Hz or greater. Replaceable modules include a laser chamber; a pulse power system comprised of three modules; an optical resonator comprised of a line narrowing module and an output coupler module; a wavemeter module, an electrical control module, a cooling water module and a gas control module. Important improvements have been provided in the pulse power unit to produce faster rise time and improved pulse energy control. These improvements include an increased capacity high voltage power supply with a voltage bleed-down circuit for precise voltage trimming, an improved communication module that generates a high voltage pulse from the capacitors charged by the high voltage power supply and amplifies the pulse voltage 23 times with a very fast voltage transformer having a secondary winding consisting of a single four-segment stainless steel rod. A novel design for the compression head saturable inductor greatly reduces the quantity of transformer oil required and virtually eliminates the possibility of oil leakage which in the past has posed a hazard.

37 Claims, 30 Drawing Sheets

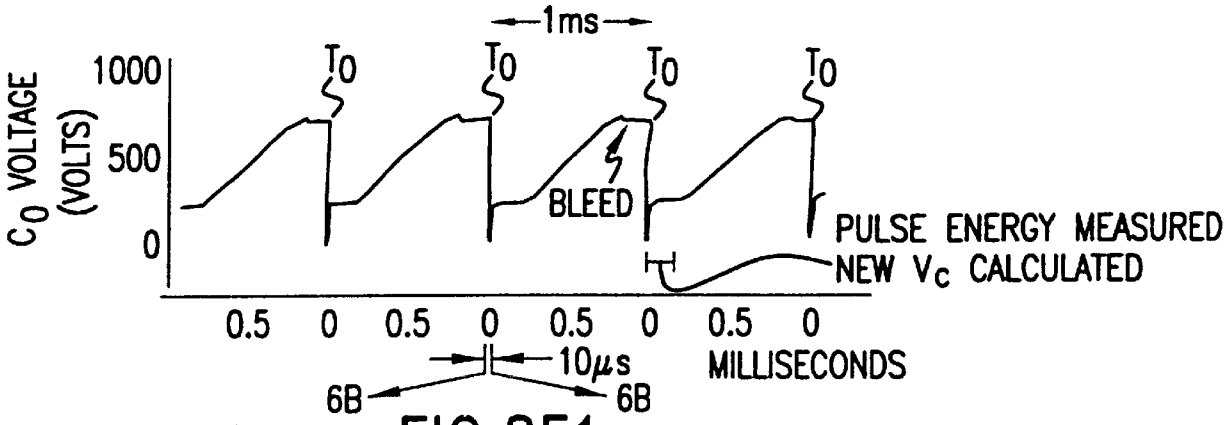
FIG.8F1
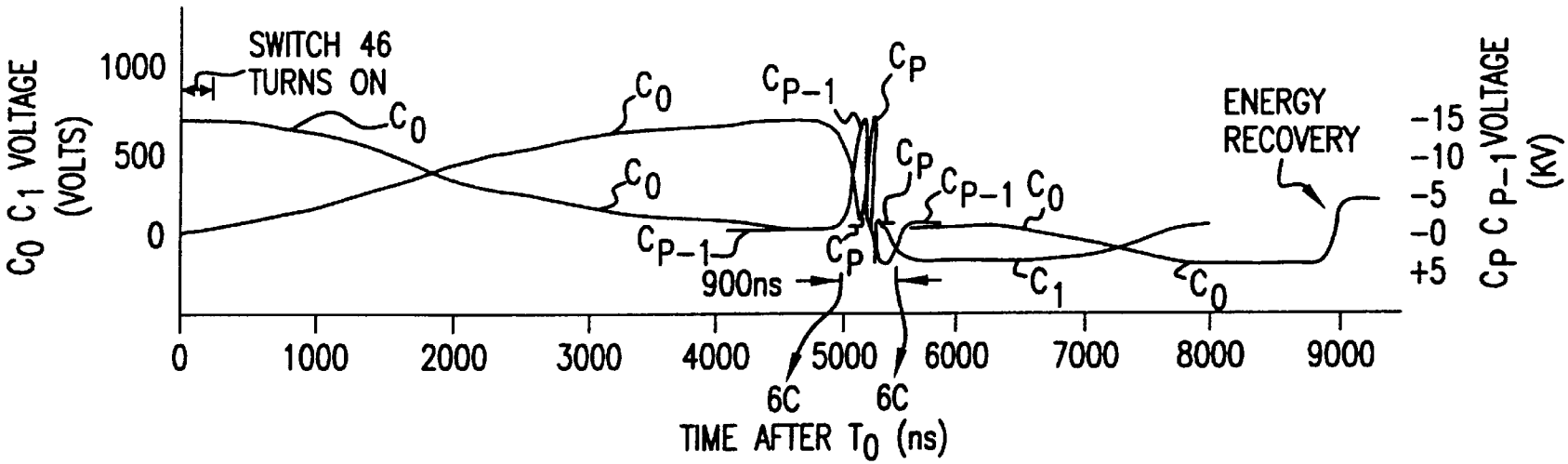
FIG.8F2

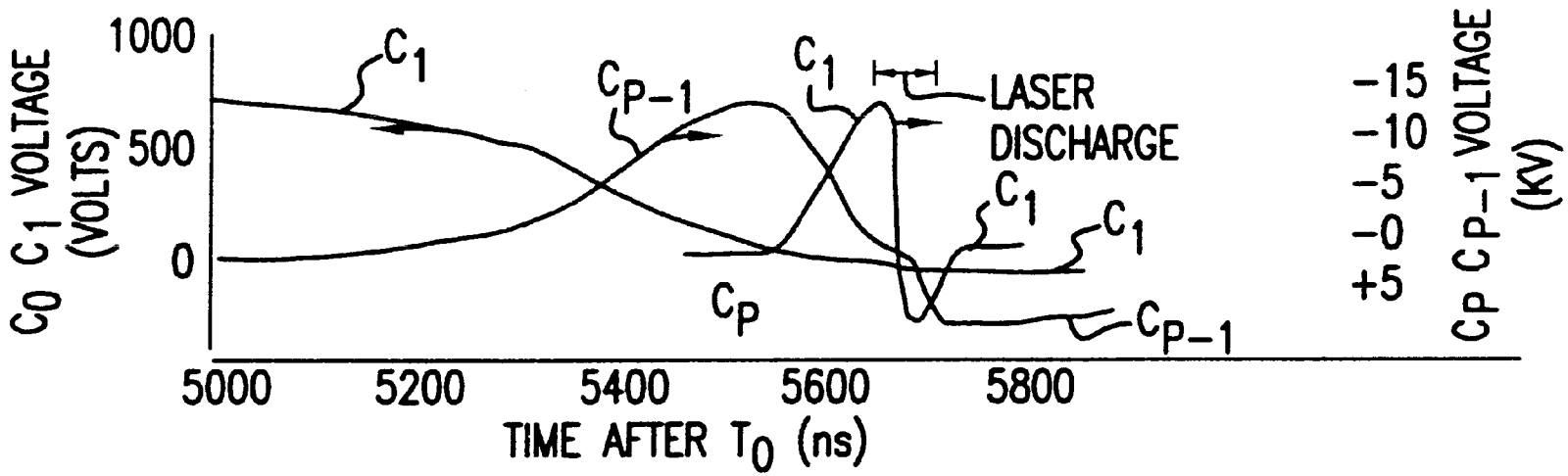
FIG.8F3

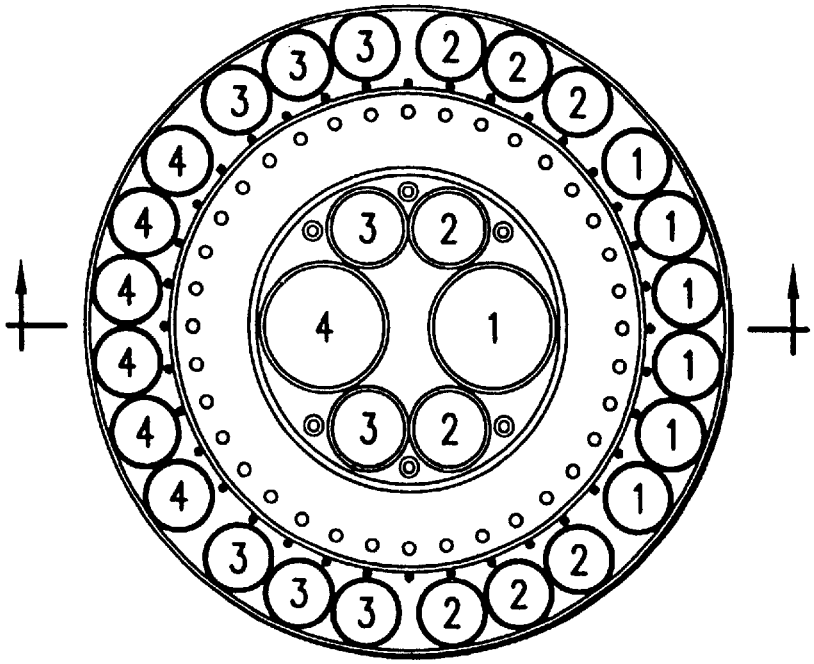
FIG.8G1
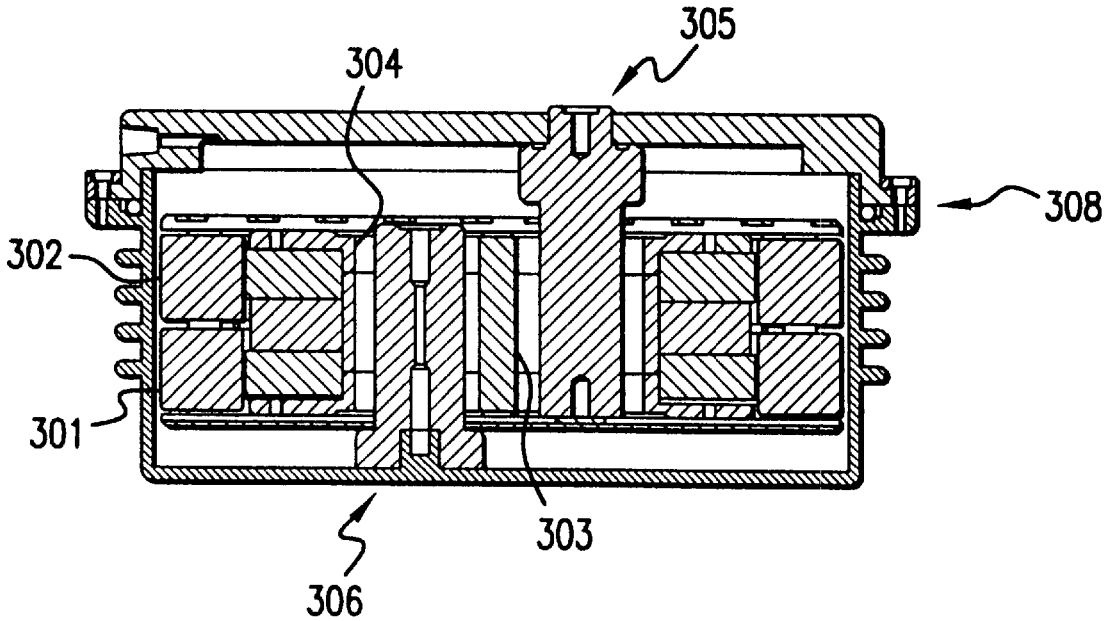
FIG.8G2

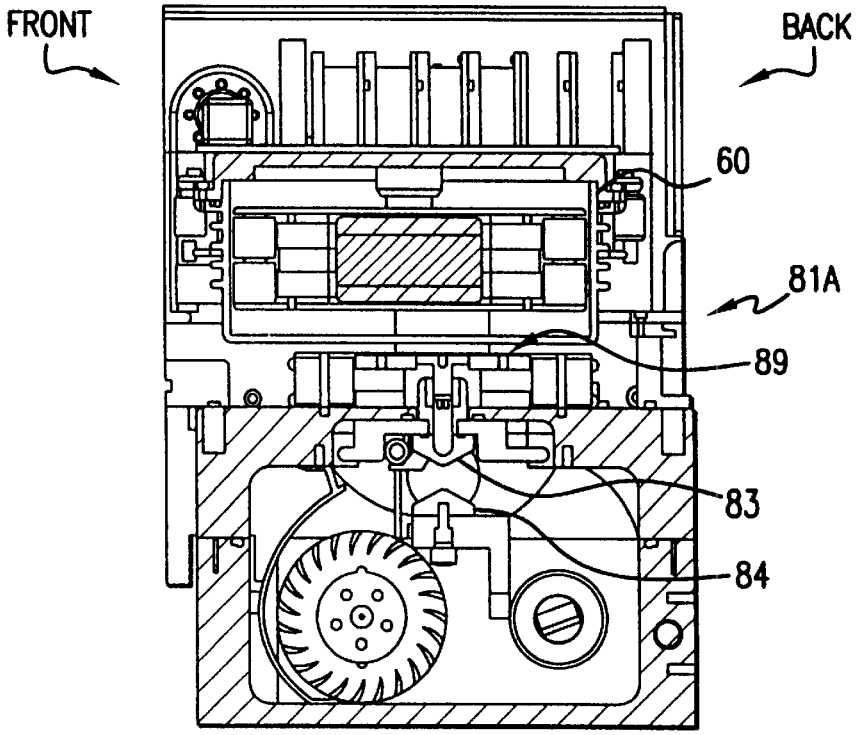
FIG.8H1
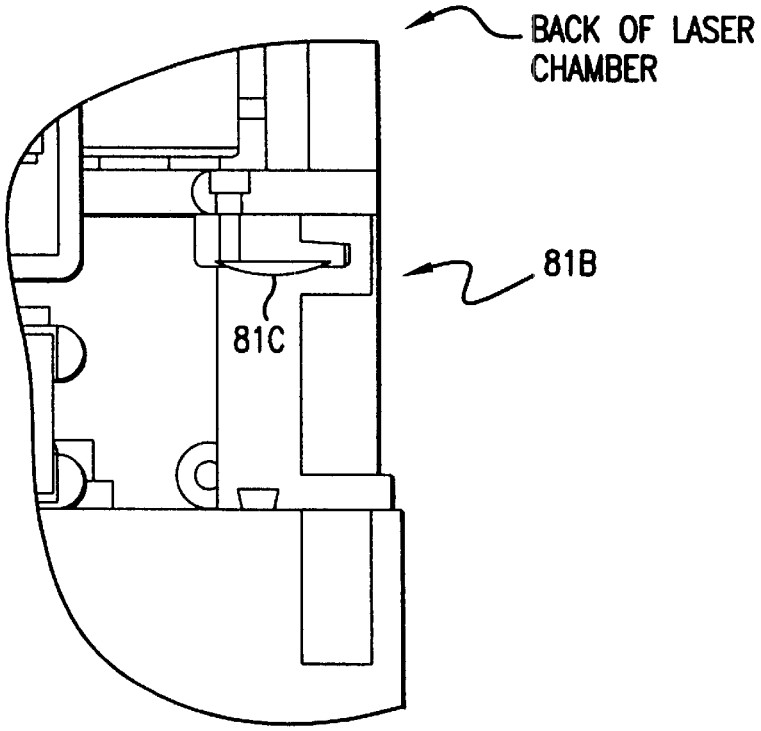
FIG.8H2

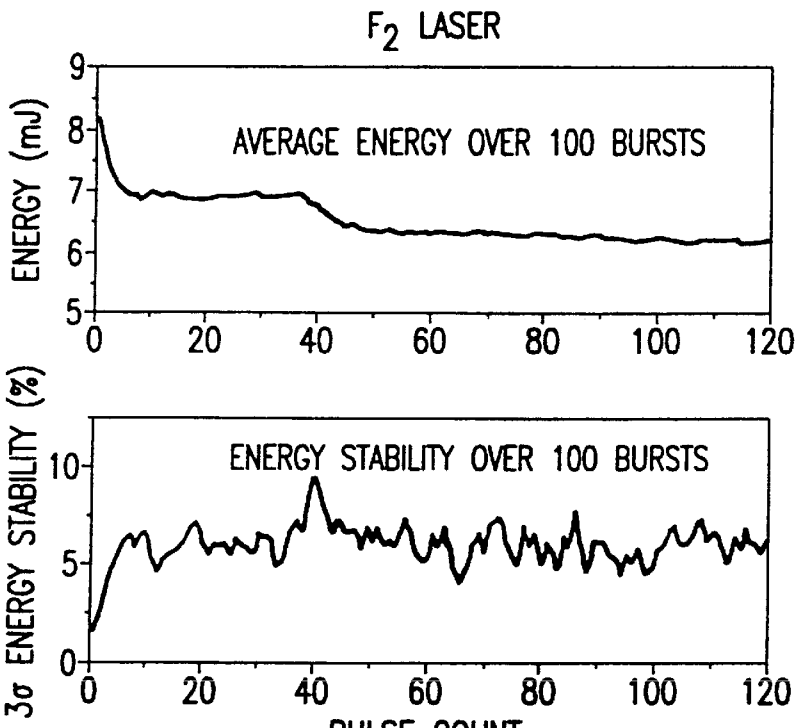
FIG.10B1
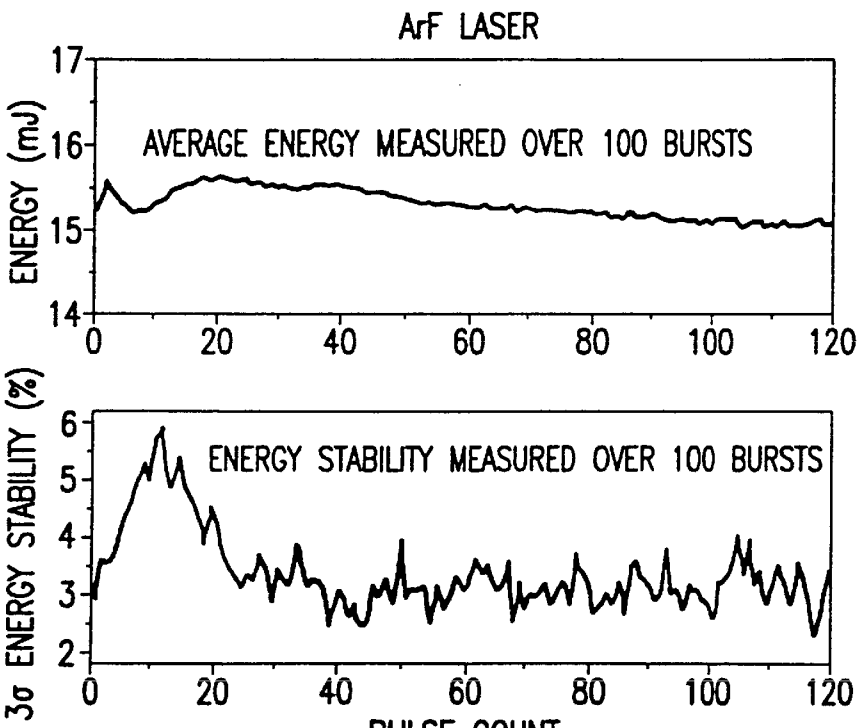
FIG.10B2

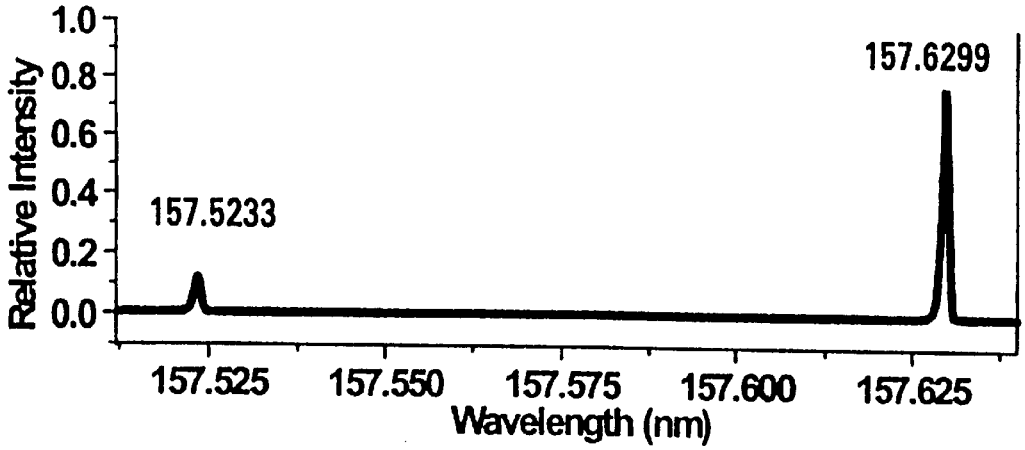
FIG.10D1
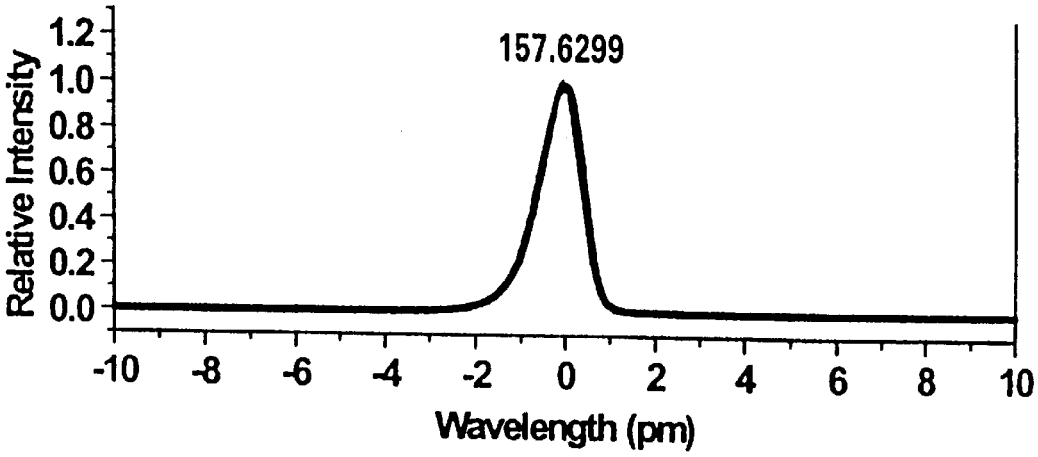
FIG.10D2

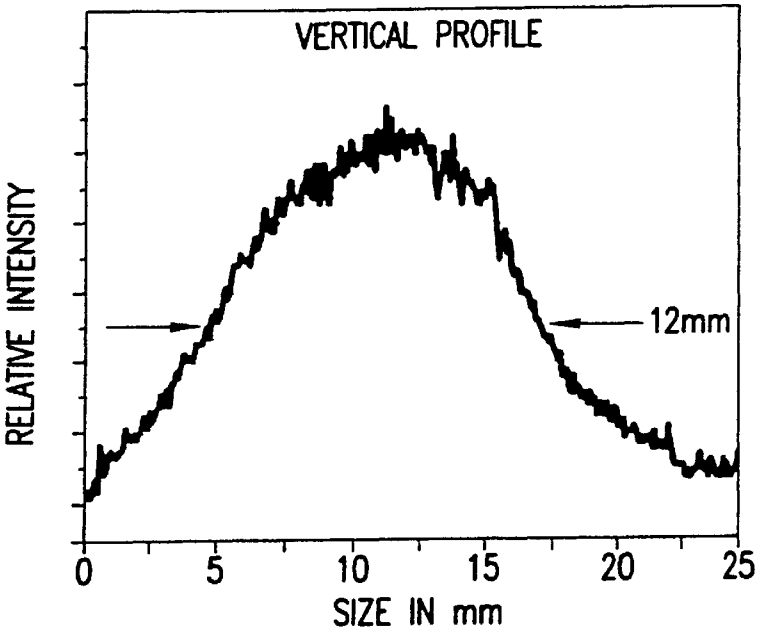
FIG.10E2
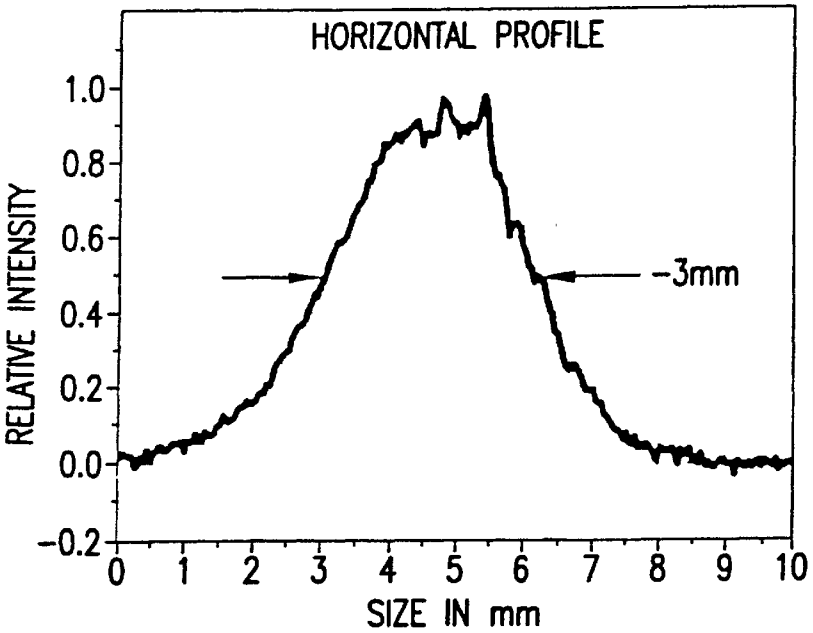
FIG.10E1

RELIABLE, MODULAR, PRODUCTION QUALITY NARROW-BAND HIGH REP RATE $F_2$ LASER

Matter enclosed in heavy brackets [ ] appears in the original patent but forms no part of this reissue specification; matter printed in italics indicates the additions made by reissue.

This application is a Continuation-In-Part of Ser. No. 09/271,041, Reliable, Modular, Production Quality Narrow-Band High Rep Rate ArF Excimer Laser filed Mar. 17, 1999; Ser. No. 09/041,474. Reliable, Modular, Production Quality Narrow Band KrF excimer Laser, filed Mar. 11, 1998; Ser. No. 08/995,832, Excimer Laser Having Pulse Power Supply with Fine Digital Regulation, filed Dec. 22, 1997; Ser. No. 08/896,384 Wavelength Reference for Excimer Laser, filed Jul. 18, 1997; Ser. No. 08/939,611, Protective Overcoat for Replicated Diffraction Gratings, filed Sep. 29, 1997; Ser. No. 08/947,474, Narrow Band Excimer Laser, filed Oct. 10, 1997; Ser. No. 09/034,870, Pulse Energy Control for Excimer Laser, filed Mar. 4, 1998; Ser. No. 09/082,139, Narrow Band Excimer Laser with Gas Additive, filed May 20, 1998; Ser. No. 09/157,067, Reliable Modular Production Quality Narrow Band High Rep Rate Excimer Laser, filed Sep. 18, 1998; Ser. No. 09/162,341, Line Narrowing Apparatus with High Transparency Prism Beam Expander filed Sep. 28, 1998; Ser. No. 09/165,593, Wavelength System for an Excimer Laser filed Oct. 2, 1998; Ser. No. 09/206,526, Wavelength Reference for Laser, filed Dec. 7, 1998; Ser. No. 09/211,825, High Pulse Rate Power System with Resonant Power Supply filed Dec. 15, 1998; Ser. No. 09/217,340 Durable Etalon Based Output Coupler filed Dec. 21, 1998 all of which are incorporated herein by reference. This invention relates to lasers and in particular to narrow-band ArF excimer lasers.

BACKGROUND OF THE INVENTION

KrF Excimer Lasers

Krypton-Fluoride (KrF) excimer lasers are currently becoming the workhorse light source for the integrated circuit lithography industry. The KrF laser produces a laser beam having a narrow-band wavelength of about 248 nm and can be used to produce integrated circuits with dimensions as small as about 180 nm. The Argon Fluoride (ArF) excimer laser is very similar to the KrF laser. The primary difference is the laser gas mixture and a shorter wavelength of the output beam. Basically, Argon replaces Krypton and the resulting wavelength of the output beam is 193 nm. This permits the integrated circuit dimensions to be further reduced to about 120 nm. $F_2$ lasers have long been recognized as the successor to the KrF and ArF lasers in the integrated circuit lithography industry since the $F_2$ beam at 157 nm permits a substantial improvement in pattern resolution. These $F_2$ lasers can be very similar to the KrF and ArF excimer lasers and with a few modifications it is possible to convert a prior art KrF or ArF laser to operate as an $F_2$ laser. A typical prior-art KrF excimer laser used in the production of integrated circuits is depicted in FIG. 1 and FIG. 2. A cross section of the laser chamber of this prior art laser is shown in FIG. 3. A pulse power system 2 powered by high voltage power supply 3 provides electrical pulses to electrodes 6 located in a discharge chamber 8. Typical state-of-the art lithography lasers are operated at a pulse rate of about 1000 Hz with pulse energies of about 10 mJ per pulse. The laser gas (for a KrF laser, about 0.1% fluorine, 1.3% krypton and the rest neon which functions as a buffer gas) at about 3 atmospheres is circulated through the space between the electrodes at velocities of about 1,000 inches per second. This is done with tangential blower 10 located in the laser discharge chamber. The laser gases are cooled with a heat exchanger 11 also located in the chamber and a cold plate (not shown) mounted on the outside of the chamber. The natural bandwidth of the excimer lasers is narrowed by line narrowing module 18. Commercial excimer laser systems are typically comprised of several modules that may be replaced quickly without disturbing the rest of the system. Principal modules include:

Laser Chamber Module,

Pulse Power System with: high voltage power supply module, commutator module and high voltage compression head module, Output Coupler Module, Line Narrowing Module, Wavemeter Module;

Computer Control Module,

Gas Control Module,

Cooling Water Module

Electrodes 6 consist of cathode 6A and anode 6B. Anode 6B is supported in this prior art embodiment by anode support bar 44 which is shown in cross section in FIG. 3. Flow is clockwise in this view. One corner and one edge of anode support bar 44 serves as a guide vane to force air from blower 10 to flow between electrodes 6A and 6B. Other guide vanes in this prior art laser are shown at 46, 48 and 50. Perforated current return plate 52 helps ground anode 6B to the metal structure of chamber 8. The plate is perforated with large holes (not shown in FIG. 3) located in the laser gas flow path so that the current return plate does not substantially affect the gas flow. A peaking capacitor comprised of an array of individual capacitors 19 is charged prior to each pulse by pulse power system 2. During the voltage buildup on the peaking capacitor, two preionizers 56 weakly ionize the lasing gas between electrodes 6A and 6B and as the charge on capacitors reach about 16,000 volts, a discharge across the electrode is generated producing the excimer laser pulse. Following each pulse, the gas flow between the electrodes of about 1 inch per millisecond, created by blower 10, is sufficient to provide fresh laser gas between the electrodes in time for the next pulse occurring one millisecond later.

In a typical lithography excimer laser, a feedback control system measures the output laser energy of each pulse, determines the degree of deviation from a desired pulse energy, and then sends a signal to a controller to adjust the power supply voltage so that energy of subsequent pulses are close to the desired energy. In prior art systems, this feedback signal is an analog signal and it is subject to noise produced by the laser environment. This noise can result in erroneous power supply voltages being provided and can in turn result in increased variation in the output laser pulse energy.

These excimer lasers are typically required to operate continuously 24 hours per day, 7 days per week for several months, with only short outages for scheduled maintenance. One problem experienced with these prior-art lasers has been excessive wear and occasional failure of blower bearings.

A need exists in the integrated circuit industry for a modular, reliable, production line quality $F_2$ laser in order to permit integrated circuit resolution not available with KrF and ArF lasers.

SUMMARY OF THE INVENTION

The present invention provides a reliable, modular, production quality $F_2$ excimer laser capable of producing, at repetition rates in the range of 1,000 to 2,000 Hz or greater, laser pulses with pulse energies greater than 10 mJ with a full width half, maximum bandwidth of about 1 or less. Preferred embodiments of the present invention can be operated in the range of 1000 to 4000 Hz with pulse energies in the range of 10 to 5 mJ with power outputs in the range of 10 to 40 watts. Using this laser as an illumination source, stepper or scanner equipment can produce integrated circuit resolution of 0.1 $\mu$m or less. Replaceable modules include a laser chamber and a modular pulse power system.

Important improvements over prior art excimer lasers have been provided in the pulse power unit to produce faster charging. These improvements include an increased capacity high voltage power supply, an improved communication module that generates a high voltage pulse from capacitors charged by the high voltage power supply and amplifies the pulse voltage about 23 times with a very fast voltage transformer having a secondary winding consisting of a single four-segment stainless steel rod. A novel design for the compression head saturable inductor (referred to herein as a "pots and pans" design) greatly reduces the quantity of transformer oil required and virtually eliminates the possibility of oil leakage which in the past has posed a hazard.

Improvements in the laser chamber permitting the higher pulse rates and improved performance include the use of a single preionizer tube.

In a preferred embodiment the laser was tuned to the $F_2$ 157.6 nm line using a set of two external prisms. In a second preferred embodiment the laser is operated broad band and the 157.6 nm line is selected external to the resonance cavity. In a third preferred embodiment a line width of 0.2 pm is provided using injection seeding.

Other embodiments of the present invention include ceramic bearings. Optionally magnetic bearings may be utilized. Reaction forces on the bearings may be reduced by providing an aerodynamic contour on the anode support bar. Other improvements include use of acoustic baffles for laser chambers producing disruptive acoustic shock waves.

Preferable the intracavity beam line and the output beam line fully sealed and nitrogen purged.

BRIEF DESCRIPTION OF THE DRAWINGS

FIGS. 8F1, 8F2 and 8F3 are time line charts showing pulse compression using the above preferred embodiment.

FIGS. 8G1 and 8G2 are drawing showing two views of a saturable inductor.

FIGS. 8H1 and 8H2 shows the mounting of a compression head in a preferred embodiment.

FIGS. 10A through 10F are graphs of test data taken during experiments with a prototype $F_2$ laser.

DETAILED DESCRIPTION OF PREFERRED EMBODIMENTS

First Preferred Embodiment

A preferred embodiment of the present invention can be described by reference to the drawings.

Modular Laser Design

Figure 4:
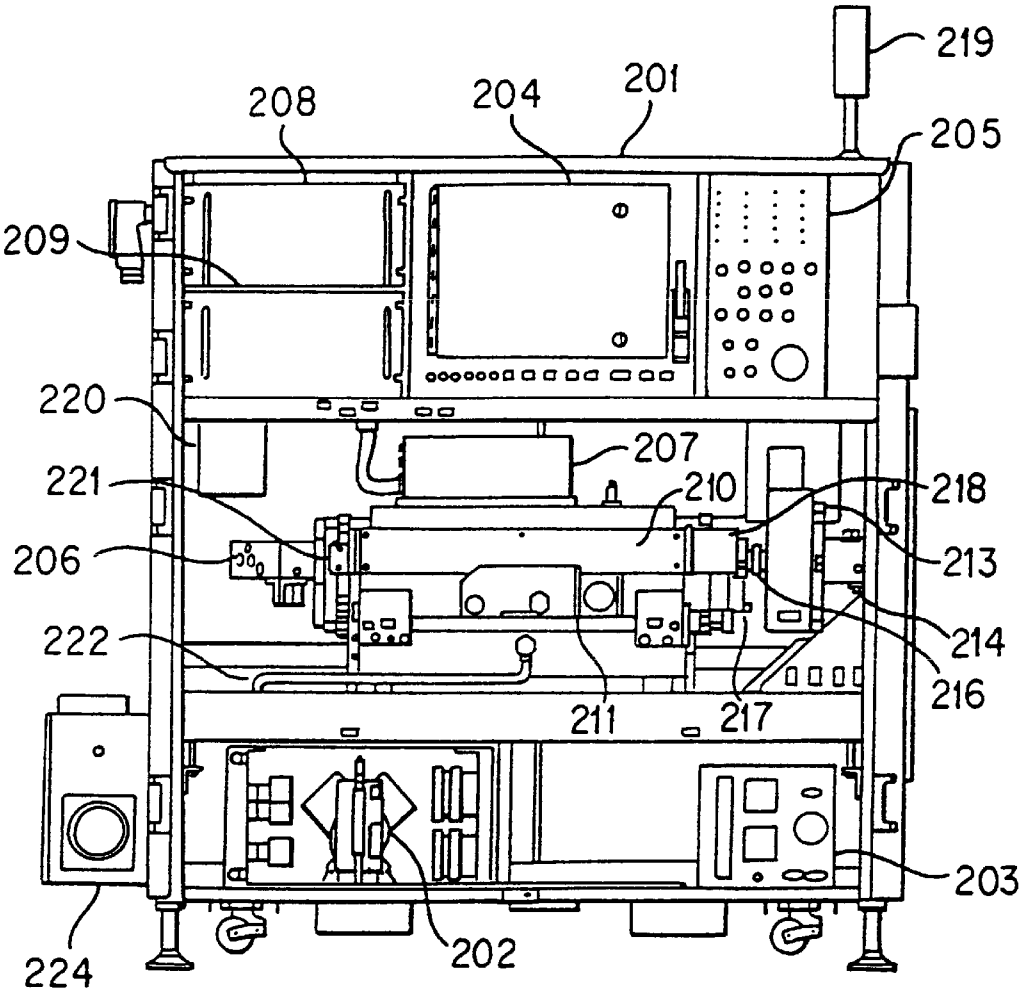
FIG. 4 is a drawing of a preferred embodiment of the present invention.

A front view of a preferred embodiment of the present invention is shown in FIG. 4 respectively. This drawing emphasizes the modular nature of their particular invention which allows very quick replacement of modules for repair, replacement and maintenance. The principal features of this embodiment are listed below corresponding to the reference numbers shown on FIG. 4.

201 Laser enclosure
202 Gas module
203 Cooling water supply module
204 AC/DC distribution module
205 Control module
206 Line narrowing module
207 Compression head
208 High voltage pulse power supply module
209 Commutator module for pulse power supply
210 Metal fluoride trap
211 Laser chamber
213 Wavemeter module
214 Automatic shutter
216 Output coupler
217 Blower motor
218 Metal fluoride trap power supply
219 Status lamp
220 24 volt power supply

221 Chamber window

222 Gas control flexible connection

224 Vent box

Preferred Embodiment

Figure 1:
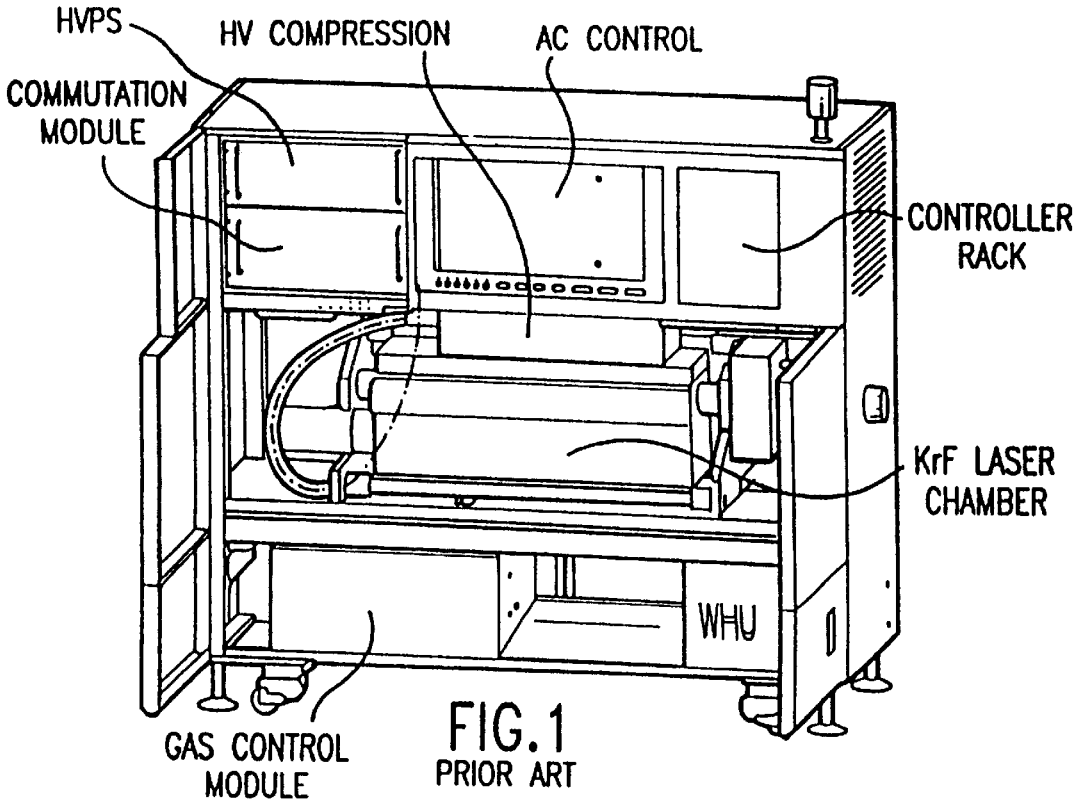
FIG.1 PRIOR ART
FIG. 1 is a drawing of a prior art commercial excimer lithography laser.
Figure 2:
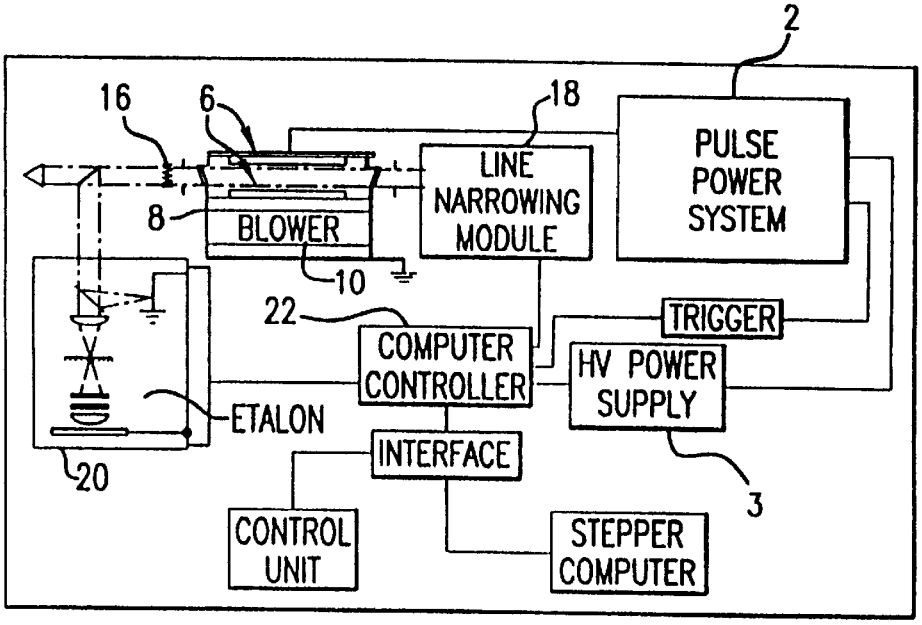
FIG.2 PRIOR ART
FIG. 2 is a block diagram showing some of the principal elements of a prior art commercial excimer lasers used for integrated circuit lithography.
Figure 3:
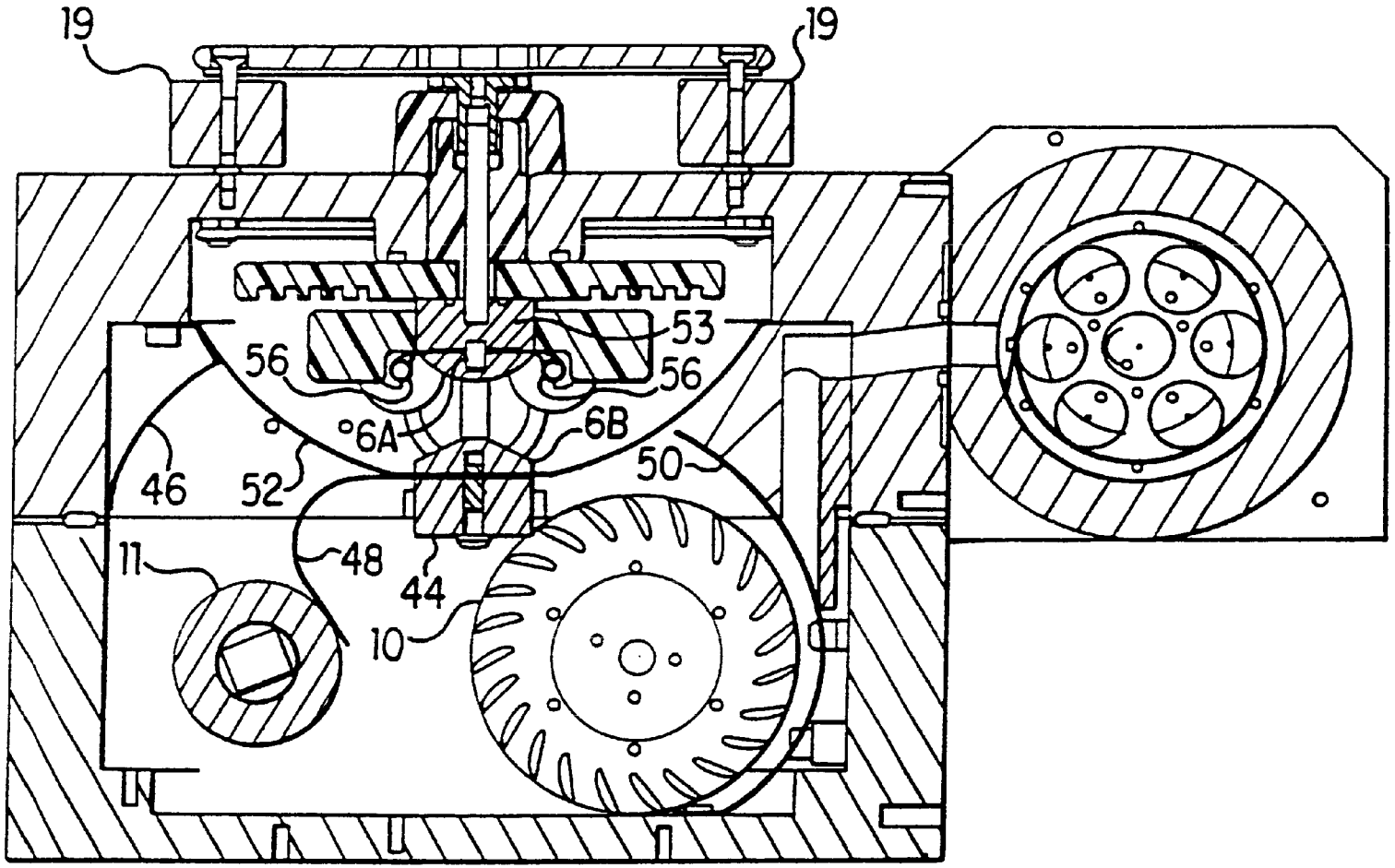
FIG. 3 PRIOR ART
FIG. 3 is a drawing of the laser chamber of the FIG. 2 laser.

A preferred embodiment of the present invention is an improved version of the laser described in FIGS. 1, 2 and 3. This preferred embodiment includes the following improvements:

1) A single tube larger preionizer replaces the prior-art combination of a two-tube preionizer to provide improved efficiency, better preionization and improved laser gas flow between the electrodes;
2) A silicon-free fan blade which may be a one-piece machined blade;
3) The solid-state pulse power system has been modified to produce faster rise time, providing more consistent pulses, and improved laser efficiency at higher voltages;
4) More precise control of the charging voltage of the pulse power system;
5) A computer controller programmed with a new algorithm providing a much improved control of pulse energy and burst energy; and
6) Electrode spacing has been reduced to 10 mm.

Chamber Improvements

Single Preionizer Tube

Figure 6:
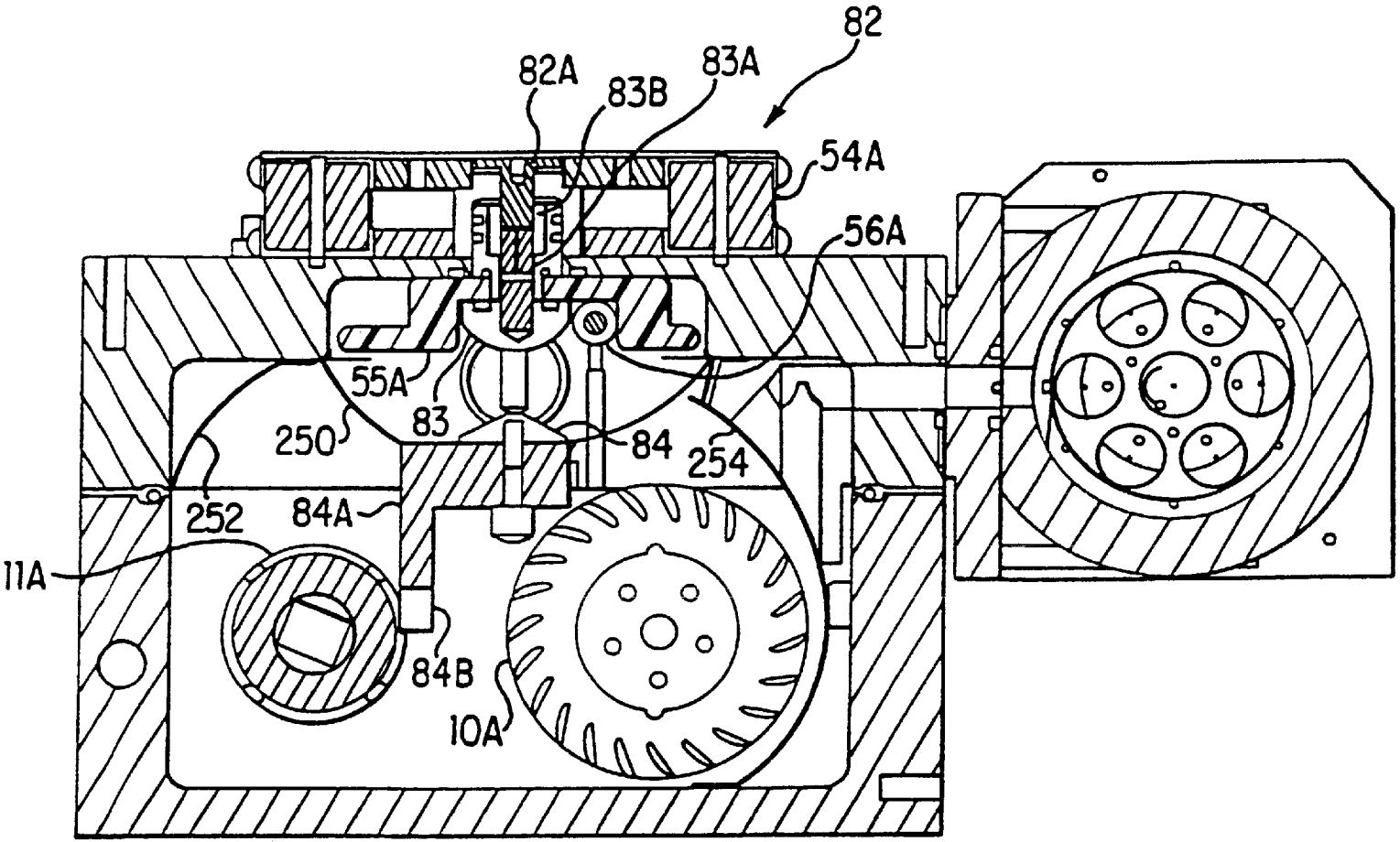
FIGS. 6 and 6A are cross section drawings of laser chambers of preferred embodiments of the present invention.

As shown in FIG. 6, a single larger preionizer tube 56A has replaced the two-preionizer tubes 56 shown in FIG. 3. The single tube preionizer is fabricated in accordance with the description in U.S. Pat. No. 5,719,896, Issued Feb. 17, 1998, which is incorporated herein by reference. Applicants have discovered that one preionizer tube is not only sufficient, but very surprisingly provides improved performance over the two-preionizer design. In this embodiment the preionizer is located upstream of the electrodes. Applicants have determined that the one tube preionizer improves in the pulse=to-pulse stability by providing improved spatial stability of the discharge.

Figure 7:
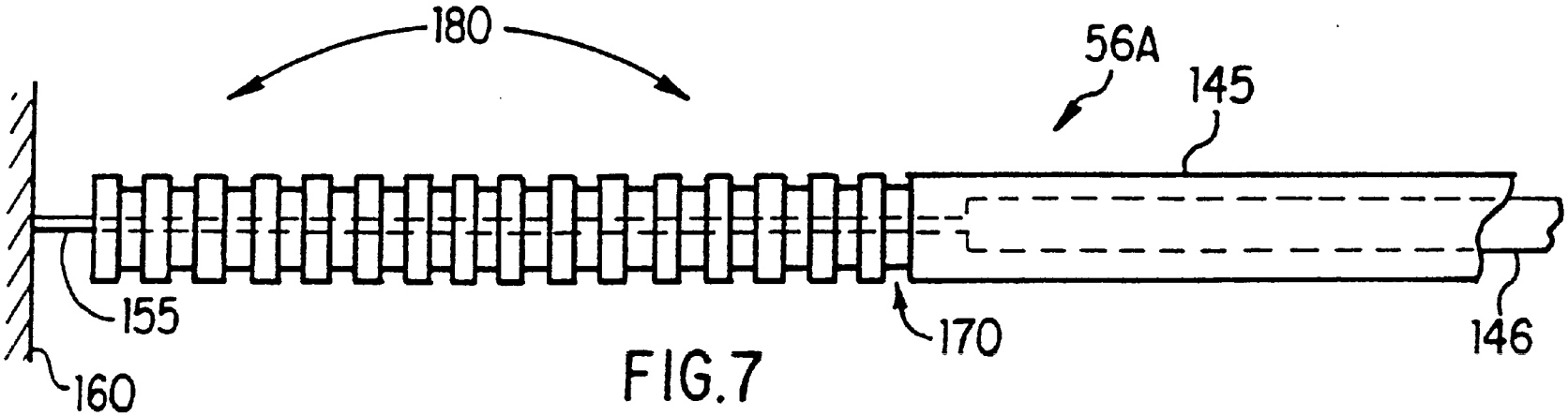
FIG. 7 is a drawing showing features of a preferred preionizer tube.

Referring now to FIG. 7, this preionizer utilizes an integrated tube design, having bushing element 180 with anti-tracking grooves 170 incorporated therein as an integral component of the tube. The diameter of the rod portion 145 and the OD of the bushing portion 180 of the preionizer is ½ inch. The inside conductor rod 146 has a diameter of 7/37 inch and the connecting wire extending through the bushing section to make a ground connection is about 1/16 inch diameter. Prior preionizer tube designs utilized a two-diameter design, with the rod portion at about ¼ inch diameter and the bushings at about 1 inch diameter. This necessitated, for manufacturing purposes, a bonding process to join the bushing component with the tube component. The constant diameter, thicker tube design is contrary to conventional design rules, which would predict a reduction in ionization due to lower capacitances. In most designs, the tube thickness is dependent upon the dielectric strength of the material selected. Those skilled in the art will recognize that the prior art conventional preionizer tube design technique is to select a material with the highest dielectric strength and determining a wall thickness to match this capacity. For example, a sapphire material is known to have a dielectric strength ranging from 1200 volts/mil to 1700 volts/mil. Therefore, a dielectric thickness of 0.035 inches thick, provides a safety factor of 2 if the laser operates at 25 kV. This design yields a lower capacitance; however, the actual effect of this reduced capacitance on laser operation was discovered to be negligible, with a surprising increase in the measured geometric irradiation of the electrode gap. Because of the constant diameter, thicker tube wall, integral bushing design, a single piece of material can be machined to provide anti-tracking grooves 170. Because of the single piece construction, there is no need to use ultra-pure (i.e., 99.9%) polycrystalline translucent aluminum oxide ceramic, although Applicants continue to use the ultra-pure material. There is no requirement to perform the difficult surface polishing of tube geometries in preparation for diffusion bonding to artificially create the integral relationship between bushing 180 and tube 145. In fact, it has been determined that high purity is not as important a property as porosity of the material. It has been found that the greater the porosity, the more the dielectric strength is reduced. As a result, a commercial grade ceramic, preferably with purity of at least 99.8% and low porosity, such as that manufactured by Coors Ceramics Company under the material No. AD-998E and having a dielectric strength of 300 volts/mil may be used. Bushings 180, having anti-tracking grooves 170 disposed therein, as previously described, act to prevent high voltage tracking axially along the surface of the tube from the cathode to the ground plane 160.

As explained above, Applicants have discovered that a single preionizer works dramatically better than two preionizers, and as explained above the first preferred embodiment places the single preionizer system upstream of the electrodes. Applicants have also experimented with the single preionizer located downstream and has discovered that at certain blower speeds this arrangement produces substantially better pulse energy stability than the upstream arrangement on the two tube arrangement.

High Efficiency Chamber

Figure 6A:
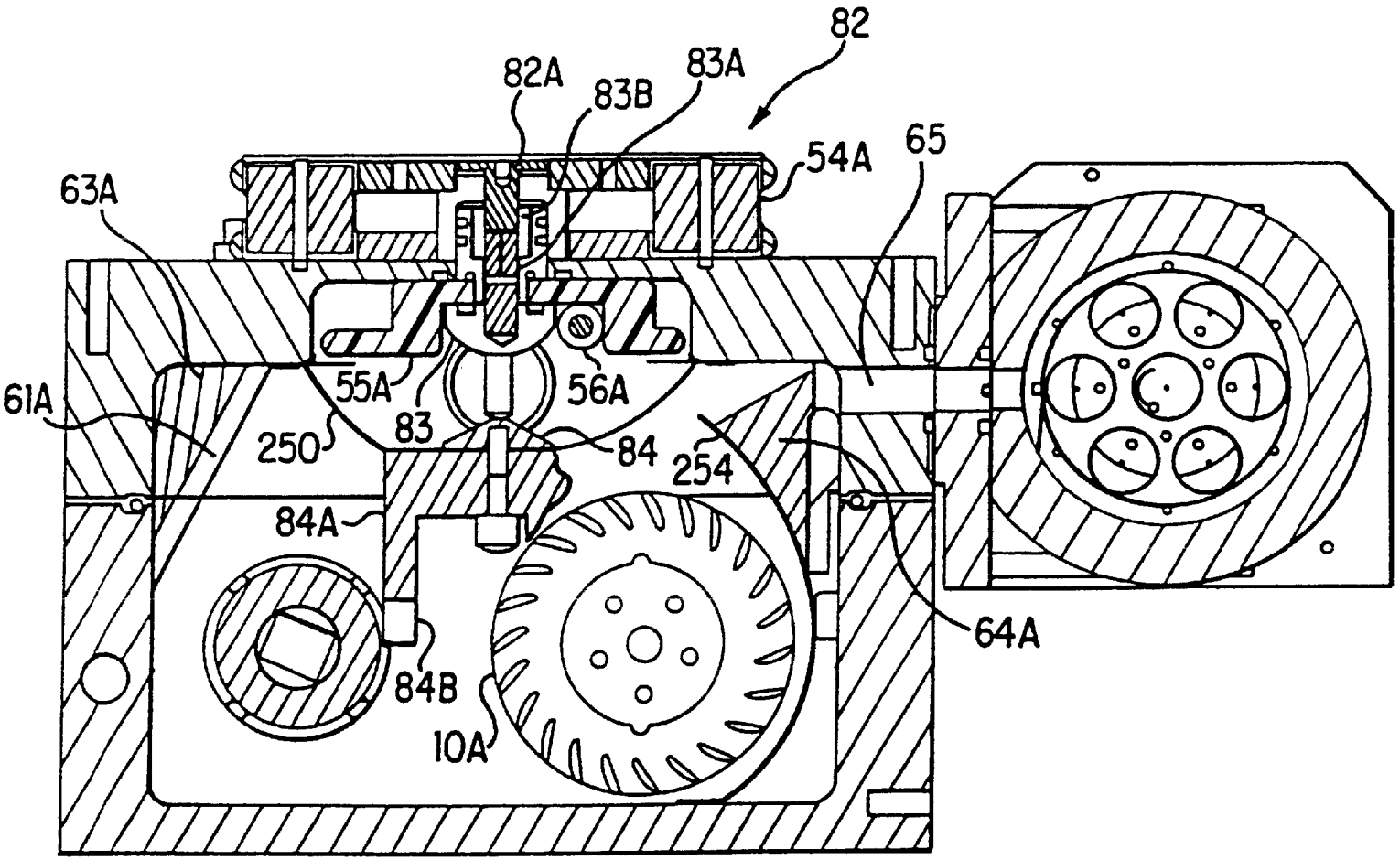

Improvements have been made to the chamber to improve the efficiency of the laser. A single piece cathode insulator 55A comprised of alumina, $Al_2O_3$ insulates the cathode from the upper chamber structure as shown in FIG. 6A. In a prior art design, eight separate insulators were needed to avoid insulator cracking due to thermal expansion stress in the insulator. This important improvement permitted the head portion of the chamber to be made shorter which significantly reduced the distance between cathode 83 the peaking capacitor 82. The individual capacitors 54A forming the peaking capacitor array 82 were moved horizontally in closer to the cathode as compared to the prior art. To reduce thermal expansion difference between the single piece insulator and the chamber structure the upper chamber 8A was fabricated from ASTM A3C steel which has a coefficient of thermal expansion closer to $Al_2O_3$ than aluminum. The bottom section 8B of chamber 8 is aluminum, but Applicants have determined that the difference in thermal expansion between ASTM A3C steel and aluminum is not a problem. Both the steel and aluminum parts are nickel coated.

Prior art cathodes for commercial lithography lasers were typically supported by a cathode support bar 53 as shown in FIG. 3. In this preferred embodiment, the cathode support bar was eliminated and the cathode 83 was made slightly thicker and mounted directly on the single piece insulator 55A. The cathode 83 is connected to the high voltage side 82A of peaking capacitor 82 by 15 feed through rods 83A and connecting nuts 83B. In the preferred embodiment, a new anode support bar 84A is substantially more massive than prior art anode support bars and comprises fins 84B located in the gas flow region. Both of these features minimize temperature variations of the anode.

Metal Seals

Applicants have discovered that prior art elastomer seals reacted with fluorine gas to produce contaminants in the laser gas which degraded laser performance. A preferred embodiment of the present invention uses all metal seals to seal the laser chamber. The preferred metal seals are tin plated inconel 1718 seals.

Monel Current Return and Vanes

Applicants have also discovered that elements of stainless steel also react with fluorine to produce contaminants in the laser gas. Therefore, in this preferred embodiment, prior art stainless steel current return structures and gas flow vanes have been replaced with monel current returns 250 and monel flow vanes 252 and 254.

Acoustic Baffles

Applicants have discovered that a significant cause of distortion of the quality of laser beams produced by narrow-band excimer lasers operating at 2000 Hz or greater is acoustic shock waves created by the electric discharge of one pulse which reflects from elements of chamber structure back to the space between the electrodes and distorts the laser beam of the next pulse occurring 0.5 millisecond later. An embodiment described herein (see FIG. 6A) substantially minimizes this effect by providing angled, grooved acoustic baffles 63A and 64A on both sides of the laser chamber. These baffles absorb a portion of the acoustic energy and reflect a portion of the acoustic energy down into the lower region of the laser chamber away from the electrodes. In this preferred embodiment, the baffles consist of a machined metal structure with grooves 0.1 mil wide, 0.3 mil deep spaced at 0.2 mil intervals; a 0.3 mil deep groove is shown at 63 in baffle 60 in FIG. 6A. These baffles have been shown by actual testing to substantially reduce pulse quality distortion caused by acoustic shock waves.

Applicants have also discovered that acoustic shock effects can be minimized by reducing streamers in the electric discharge. In fact, in a preferred embodiment of the present invention changes made in the chamber head (discussed above) and the new preionizer designed reduced acoustic shock so that acoustic baffles were not needed.

Fan Improvements

This preferred embodiment of the present invention includes major improvements in the prior art gas circulator which has greatly improved laser performance. These improvements are in the construction of a braze free blower blade structure. A new non-symmetrical blade arrangement which greatly decreases resonance effects and improved bearings.

Silicon Free Fan Blade Structure

Applicants have discovered that a brazing material commonly used in blower blade construction was the primary source of $SiF_6$ in the laser chamber. This gas significantly degraded laser performance for KrF lasers but was a total disaster for ArF lasers and $F_2$ lasers. Applicants have identified four solutions to this problem. First the blade structure was machined in segments from a solid block of material (in this case aluminum). Another solution was to cast the blade structure in segments. The segments then are welded together using electron beam welding in which no new material is added. It is also feasible to fabricate the blade structure by joining blades to a frame structure but in this case the joining is by electron beam welding instead of the prior art brazing process. The fourth method is to join the blade to a frame structure using a soldering process using a silicon free solder. Aluminum 6061 is used as the base material for all of the component pieces. These parts are then copper-plated in prelude to the soldering process. With all of the parts assembled, the fan is then soldered together using a low temperature solder, typically 91% tin (Sn) and 9% Zinc (Zn) in a vacuum furnace. This solder is chosen due to its lack of silicon and its ability to work with copper plated aluminum. The assembled and soldered fan is then nickel-plated. This method of construction yields a non-silicon fan that is inexpensive to manufacture.

Reducing Resonance Effects

Prior art blower blade structures consisted of a tangential blower with 23 longitudinal blades. These blades were mounted symmetrically at the circumference of the structure. Substantial resonance effects were measured both with respect to fan parameters and actual laser performance. Perturbations in the laser beam were shown to correspond to acoustic waves at 23 times the rotating frequency of the fan. Adverse affects on bearing performance were also measured corresponding to 23 times the fan's rotating frequency.

Figure 14B:
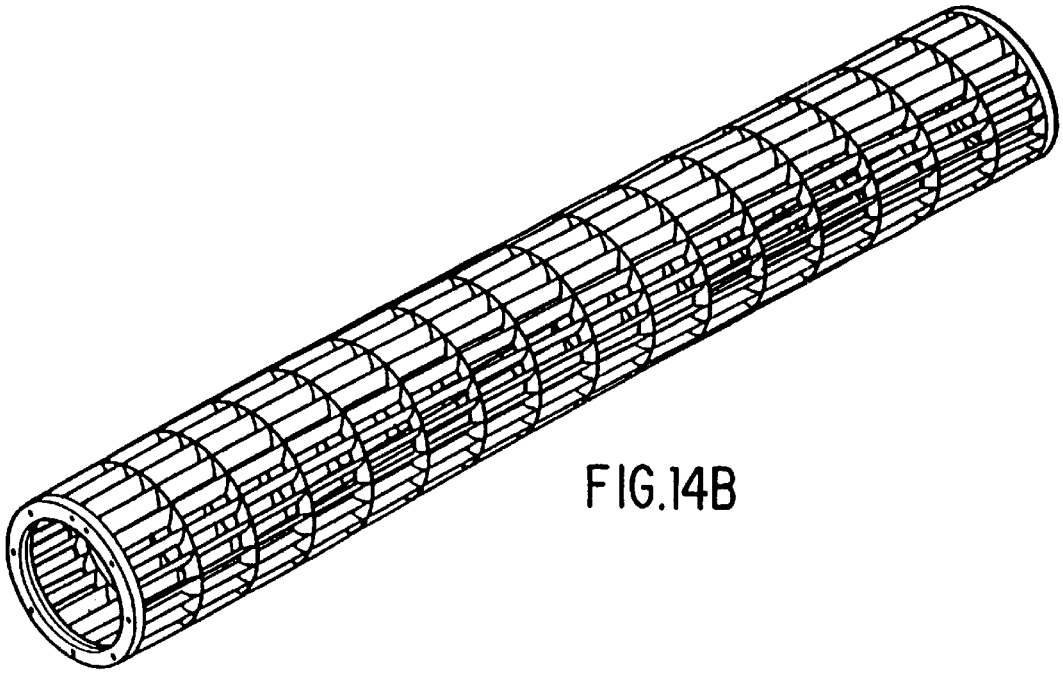
FIGS. 14A, 14B and 14C show preferred blower blade structure designs.
Figure 14A:
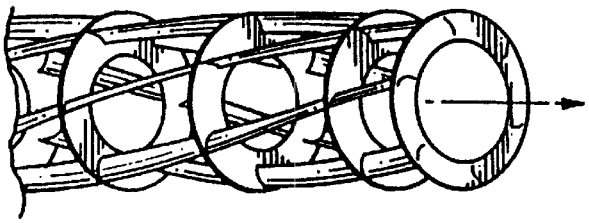
Figure 14C:
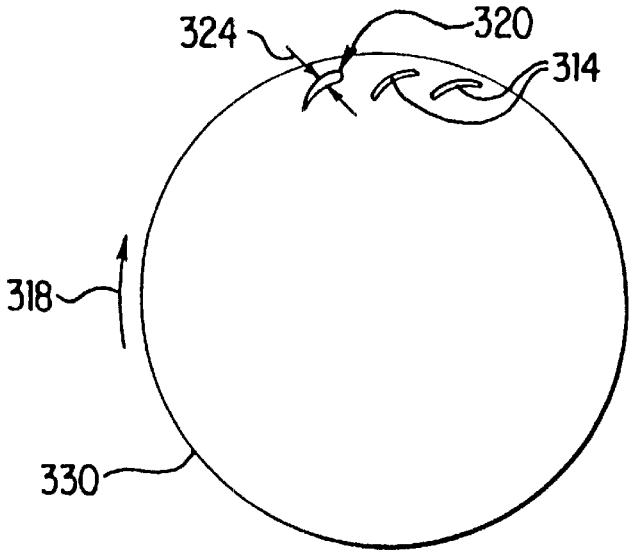

Improvements in fan structure design call for a non symmetrical blade arrangement such as that shown in FIG. 14A. An alternative as shown in FIG. 14B where the fan blade structure is formed of 16 separate machined or cart segments with each segment having 23 blades is to rotate each segment by 360°/(15×23) or about 1° relative to the adjacent segment. Another improvement which is made relatively easy in the machine or cast approach to fan blade structure fabrication is to form the blades into air foils as shown at 320 in FIG. 14C. Prior art blades were stamped and a cross section of the two of the stamped blades are shown for comparison at 314. The direction of rotation is shown at 318 and 330 represents the circumference of the blade structure. Whereas conventional blades are uniform in thickness, airfoil blades have a tear shape profile including a rounded leading edge, a thickened midsection and a tapered trailing edge.

Bearing Improvements

Embodiments of the present invention will be made available with one of two alternative bearing improvements over the prior art.

Ceramic Bearings

A preferred embodiment of the present invention includes ceramic bearings. The preferred ceramic bearings are silicon nitride lubricated with a synthetic lubricant, preferably perfluoropolyalkylether (PFPE). These bearings provide substantially greater life as compared to prior art excimer laser fan bearings. In addition, neither the bearings nor the lubricant are significantly affected by the highly reactive fluorine gas.

Magnetic Bearings

Figure 5:
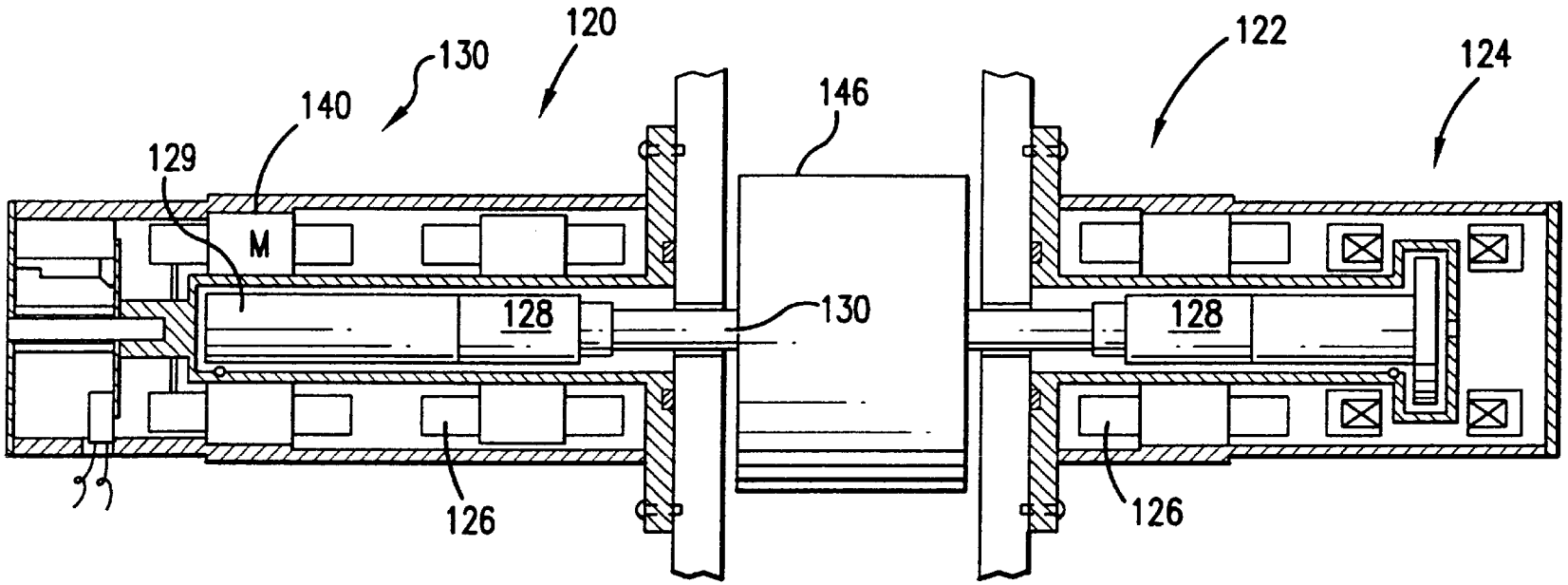
FIG. 5 is a drawing showing a blower drive unit including magnetic bearings.

Another preferred embodiment of the present invention comes with magnetic bearings supporting the fan structure as shown in FIG. 5. In this embodiment, the shaft 130 supporting the fan blade structure 146 is in turn supported by an active magnetic bearing system and driven by a brushless DC motor 130 in which the rotor 129 of the motor and the rotors 128 of at least two bearings are sealed within the gas environment of the laser cavity and the motor stator 140 and the coils 126 of the magnetic bearing magnets are located outside the gas environment. This preferred bearing design also includes an active magnetic thrust bearing 124 which also has the coils located outside the gas environment.

Aerodynamic Anode Support Bar

As shown in FIG. 3, prior art gas flow from blower 10 was forced to flow between electrodes 6A and 6B by anode support bar 44. However, Applicants have discovered that the prior art designs of support bar 44 such as that shown in FIG. 3 produced substantial aerodynamic reaction forces on the blower which were transferred to the blower bearings resulting in chamber vibration. Applicants suspect that these vibrational forces are responsible for blower bearing wear and possibly occasional bearing failures. Applicant has tested other designs, several of which are shown in FIGS. 12A–12E, all of which reduced the aerodynamic reaction forces by distributing over a longer time period, the reaction force resulting each time a blade passes close to the edge of support bar 44. One of Applicants preferred anode support bar design is shown in FIG. 6A at 84A. This design has substantially greater mass which minimizes anode temperature savings. The total mass of the anode and the anode support bar is about 3.4 Kg. Also, this design comprises fins 84B which provides added cooling for the anode. Applicants tests have indicated that both of the acoustic baffles and the aerodynamic anode support bar tend to reduce slightly the gas flow so that is gas flow is limited, the utilization of these two improvements should involve a trade-off analysis. For these reasons two improvements are shown on FIG. 6A and not FIG. 6.

Pulse Power System

Functional Description of Four Pulse Power Modules

Figure 8A:
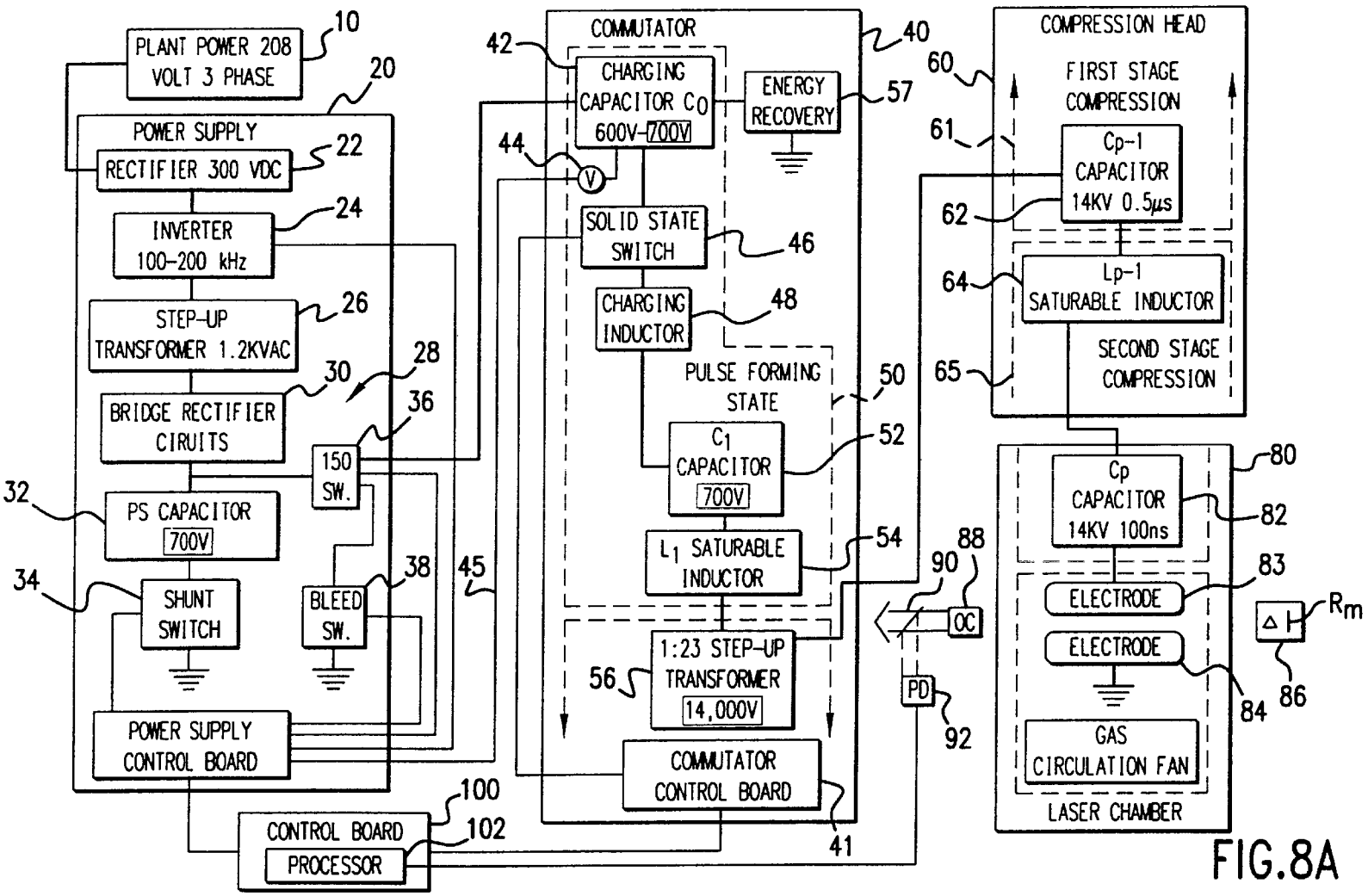
FIG. 8A is a block diagram of a pulse power system of the preferred embodiment of the present invention.
Figure 8B:
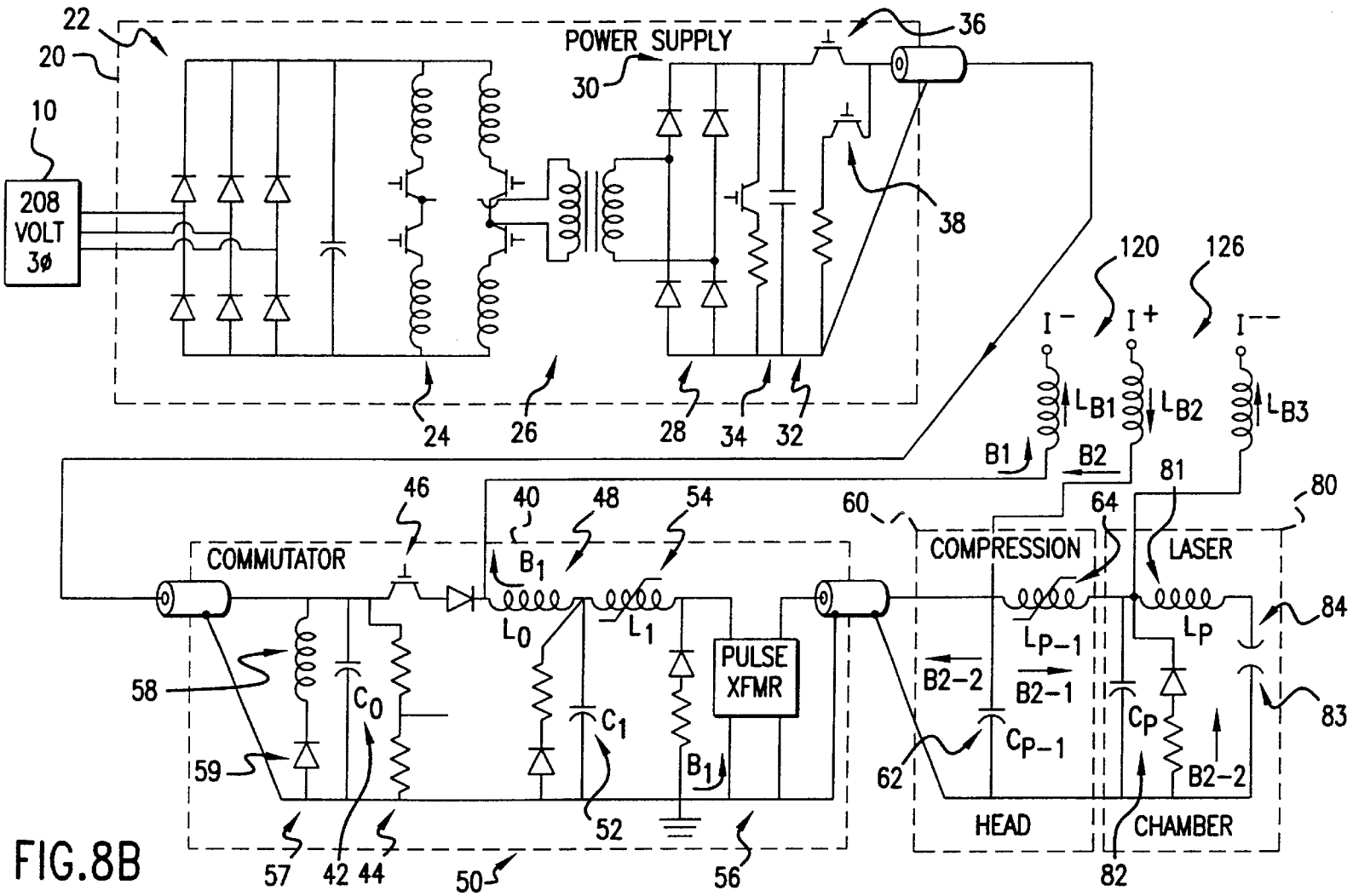
FIG. 8B is a simplified circuit diagram of the above preferred embodiment.

A preferred pulse power system is manufactured in four separate modules as indicated in FIGS. 8A and 8B, each of which becomes an important part of the excimer laser system and each of which can be quickly replaced in the event of a parts failure or in the course of a regular preventative maintenance program. These modules are designated by Applicants: high voltage power supply module 20, commutator module 40, compression head module 60 and laser chamber module 80.

High Voltage Power Supply Module

High voltage power supply module 20 comprises a 300 volt rectifier 22 for converting 208 volt three phase plant power from source 10 to 300 volt DC. Inverter 24 converts the output of rectifier 22 to high frequency 300 volt pulses in the range 100 kHz to 200 kHz. The frequency and the on period of inverter 24 are controlled by the HV power supply control board 21 in order to provide course regulation of the ultimate output pulse energy of the system. The output of inverter 24 is stepped up to about 1200 volts in step-up transformer 26. The output of transformer 26 is converted to 1200 volts DC by rectifier 28 which includes a standard bridge rectifier circuit 30 and a filter capacitor 32. DC electrical energy from circuit 30 charges 8.1 $\mu$F $C_0$ charging capacitor 42 in commutator module 40 as directed by HV power supply control board 21 which controls the operation of inverter 24 as shown in FIG. 8A. Set points within HV power supply control board 21 are set by laser system control board 100.

The reader should note that in this embodiment as shown in FIG. 8A that pulse energy control for the laser system is provided by power supply module 20. The electrical circuits in commutator 40 and compression head 60 merely serve to utilize the electrical energy stored on charging capacitor 42 by power supply module 20 to form at the rate of 2,000 times per second an electrical pulse, to amplify the pulse voltage and to compress in time the duration of the pulse. As an example of this control, FIG. 8A indicates that processor 102 in control board 100 has controlled the power supply to provide precisely 700 volts to charging capacitor 42 which during the charging cycle is isolated from the down stream circuits by solid state switch 46. The electrical circuits in commutator 40 and compression head 60 will upon the closure of switch 46 very quickly and automatically convert the electrical energy stored on capacitor 42 into the precise electrical discharge pulse across electrodes 83 and 84 needed to provide the next laser pulse as the precise energy needed as determined by processor 102 in control board 100.

Commutator Module

Commutator module 40 comprises $C_0$ charging capacitor 42, which in this embodiment is a bank of capacitors connected in parallel to provide a total capacitance of 8.1 $\mu$F. Voltage divider 44 provides a feedback voltage signal to the HV power supply control board 21 which is used by control board 21 to limit the charging of capacitor 42 to the voltage (called the "control voltage") which when formed into an electrical pulse and compressed and amplified in commutator 40 and compression head 60 will produce the desired discharge voltage on peaking capacitor 82 and across electrodes 83 and 84.

In this embodiment (designed to provide electrical pulses in the range of about 3 Joules and 16,000 volts at a pulse rate of 2000 Hz pulses per second), about 250 microseconds (as indicated in FIG. 8F1) are required for power supply 20 to charge the charging capacitor 42 to 800 volts. Therefore, charging capacitor 42 is fully charged and stable at the desired voltage when a signal from commutator control board 41 closes solid state switch 44 which initiates the very fast step of converting the 3 Joules of electrical energy stored on charging capacitor $C_0$ into a 16,000 volt discharge across electrodes 83 and 84. For this embodiment, solid state switch 46 is a IGBT switch, although other switch technologies such as SCRs, GTOs, MCTs, etc. could also be used. A 600 nH charging inductor 48 is in series with solid state switch 46 to temporarily limit the current through switch 46 while it closes to discharge the $C_0$ charging capacitor 42.

Pulse Generation Stage

The first stage of high voltage pulse power productions is the pulse generation stage 50. To generate the pulse the charge on charging capacitor 42 is switched onto $C_1$ 8.5 $\mu$F capacitor 52 in about 5 $\mu$s as shown on FIG. 8F2 by closing IGBT switch 46.

First Stage of Compression

A saturable inductor 54 initially holds off the voltage stored on capacitor 52 and then becomes saturated allowing the transfer of charge from capacitor 52 through 1:23 step up pulse transformer 56 to $C_{p-1}$ capacitor 62 in a transfer time period of about 550 ns, as shown on FIG. 8F3, for a first stage of compression 61.

The design of pulse transformer 56 is described below. The pulse transformer is extremely efficient transforming a 700 volt 17,500 ampere 550 ns pulse rate into a 16.100 volt, 760 ampere 550 ns pulse which is stored very temporarily on $C_{p-1}$ capacitor bank 62 in compression head module 60.

Compression Head Module

Compression head module 60 further compresses the pulse.

Second Stage of Compression

An $L_{p-1}$ saturable inductor 64 (with about 125 nH saturated inductance) holds off the voltage on 16.5 nF $C_{p-1}$ capacitor bank 62 for approximately 550 ns then allows the charge on $C_{p-1}$ to flow (in about 100 ns) onto 16.5 nF Cp peaking capacitor 82 located on the top of laser chamber 80 and which is electrically connected in parallel with electrodes 83 and 84 and preionizer 56A. This transformation of a 550 ns long pulse into a 100 ns long pulse to charge Cp peaking capacitor 82 makes up the second and last stage of compression as indicated at 65 on FIG. 8A.

Laser Chamber Module

About 100 ns after the charge begins flowing onto peaking capacitor 82 mounted on top of and as a part of the laser chamber module 80, the voltage on peaking capacitor 82 has reached about 14,000 volts and discharge between the electrodes begins. The discharge lasts about 50 ns during which time lasing occurs within the optical resonance chamber of the excimer laser. The optical resonance chamber is defined by a line selection package 86 comprised in this example by a 2 prism wavelength selector and a R-max mirror together, indicated as 86 in FIG. 8A and an output coupler 88. The laser pulse for this laser is a narrow band, 20 to 50 ns, 157 nm pulse of about 10 ml and the repetition rate up to 2000 pulses per second. The pulses define a laser beam 90 and the pulses of the beam are monitored by photodiode 92, all as shown in FIG. 8A.

Control of Pulse Energy

The signal from photodiode 92 is transmitted to processor 102 in control board 100 and the processor uses this energy signal and preferably other historical pulse energy data (as discussed below in the section entitled Pulse Energy Control Algorithm) to set the command voltage for the next and/or future pulses. In a preferred embodiment in which the laser operates in a series of short bursts (such as 100 pulse 0.5 second bursts at 2000 Hz separated by a dead time of about 0.1 second) processor 102 in control board 100 is programmed with a special algorithm which uses the most recent pulse energy signal along with the energy signal of all previous pulses in the burst along with other historical pulse profile data to select a control voltage for the subsequent pulse so as to minimize pulse-to-pulse energy variations and also to minimize burst-to-burst energy variations. This calculation is performed by processor 102 in control board 100 using this algorithm during a period of about 35 $\mu$s. The laser pulses occurs about 5 $\mu$s following the $T_0$ firing of IGBT switch 46 shown on FIG. 8F3 and bout 20 $\mu$s are required to collect the laser pulse energy data. (The start of the firing of switch 46 is called $T_0$.) Thus, a new control voltage value is thus ready (as shown on FIG. 8F1) about 70 microseconds after the firing of IGBT switch 46 for the previous pulse (at 2,000 Hz the firing period is 500 $\mu$s). The features of the energy control algorithm are described below and are described in greater detail in U.S. patent application Ser. No. 09/034,870 which is incorporated herein by reference.

Energy Recovery

This preferred embodiment is provided with electronic circuitry which recovers excess energy onto charging capacitor 42 from the previous pulse. This circuitry substantially reduces waste energy and virtually eliminates after ringing in the laser chamber 80.

The energy recovery circuit 57 is comprised of energy recovery inductor 58 and energy recovery diode 59, connected in series across Co charging capacitor 42 as shown in FIG. 8B. Because the impedance of the pulse power system is not exactly matched to that of the chamber and due to the fact that the chamber impedance varies several orders of magnitude during the pulse discharge, a negative going "reflection" is generated from the main pulse which propagates back from the chamber towards the front end of the pulse generating system. After the excess energy has propagated back through the compression head 60 and the commutator 40, switch 46 opens up due to the removal of the trigger signal by the controller. The energy recovery circuit 57 reverses the polarity of the reflection which has generated a negative voltage on the charging capacitor 42 through resonant free wheeling (a half cycle of ringing of the L-C circuit made up of the charging capacitor 42 and the energy recovery inductor 58) as clamped against reversal of current in inductor 58 by diode 59. The net result is that substantially all of the reflected energy from the chamber 80 is recovered from each pulse and stored on charging capacitor 42 as a positive charge ready to be utilized for the next pulse. FIGS. 8F1, 2 and 3 are time line charts showing the charges on capacitor Co, $C_1$, $C_{p-1}$ and Cp. The charts show the process of energy recovery on Co.

Magnetic Switch Biasing

In order to completely utilize the full B–H curve swing of the magnetic materials used in the saturable inductors, a DC bias current is provided such that each inductor is reverse saturated at the time a pulse is initiated by the closing of switch 46.

In the case of the commutator saturable inductors 48 and 54, this is accomplished by providing a bias current flow of approximately 15 A backwards (compared to the directional normal pulse current flow) through the inductors. This bias current is provided by bias current source 120 through isolation inductor LB1. Actual current flow travels from the power supply through the ground connection of the commutator, through the primary winding of the pulse transformer, through saturable inductor 54, through saturable inductor 48, and through isolation inductor LB1 back to the bias current source 120 as indicated by arrows B1.

In the case of compression head saturable inductor, a bias current B2 of approximate 5A is provided from the second bias current source 126 through isolation inductor LB2. At the compression head, the current splits and the majority B2-1 goes through saturable inductor Lp-b 164 and back through isolation inductor LB3 back to the second bias current source 126. A smaller fraction of the current B2-2 travels back through the HV cable connecting the compression head 60 and the commutator 40, through the pulse transformer secondary winding to ground, and through a biasing resistor back to the second bias current source 126. This second smaller current is used to bias the pulse transformer so that it is also reset for the pulsed operation. The mount of current which splits into each of the two legs is determined by the resistance in each path and is intentionally adjusted such that each path receives the correct amount of bias current.

Direction of Current Flow

In this embodiment, we refer to the flow of pulse energy through the system from a standard three-phase power source 10 to the electrodes and to ground beyond electrode 84 as "forward flow" and this direction as the forward direction. When we refer to an electrical component such as a saturable inductor as being forward conducting we mean that it is biased into saturation to conduct "pulse energy" in a direction toward the electrodes. When it is reverse conducting it is biased into saturation to conduct energy in a direction away from the electrodes toward the charging capacitor. The actual direction of current flow (or electron flow) through the system depends on where you are within the system. The direction of current flow is now explained to eliminate this as a possible source of confusion.

By reference to FIGS. 8A and 8B, in this preferred embodiment Co capacitor 42 is charged to (for example) a positive 700 volts such that when switch 46 is closed current flows from capacitor 42 through inductor 48 in a direction toward $C_1$ capacitor 52 (which means that electrons are actually flowing in the reverse direction). Similarly, the current flow is from $C_1$ capacitor 52 through the primary side of pulse transformer 56 toward ground. Thus, the direction of current and pulse energy is the same from charging capacitor 42 to pulse transformer 56. As explained below under the section entitled "Pulse Transformer" current flow in both the primary loops and the secondary loop of pulse transformer 56 is toward ground. The result is that current flow between pulse transformer 56 and the electrodes during the initial portion of the discharge (which represents the main portion |typically about 80 percent| of the discharge) is in the direction away from the electrodes toward transformer 56. Therefore, the direction of electron flow during the main discharge is from ground through the secondary of pulse transformer 56 temporarily onto $C_{p-1}$ capacitor 62 through inductor 64, temporarily onto Cp capacitor 82, through inductor 81, through electrode 84 (which is referred to as the discharge cathode) through the discharge plasma, through electrode 83 and back to ground. Thus, between pulse transformer 56 and the electrodes 84 and 83 during the main discharge electrons flow in the same direction as the pulse energy. Immediately following the main portion of the discharge, currents and electron flow are reversed and the reverse electron flow is from ground up through the grounded electrode 84, though the discharge space between the electrodes to electrode 83 and back through the circuit through transformer 56 to ground. The passage of reverse electron flow through transformer 56 produces a current in the "primary" loops of transformer 56 with electron flow from ground through the "primary" side of pulse transformer 56 (the same direction as the current flow of the main pulse) to ultimately charge Co negative as indicated qualitatively in FIG. 8F2. The negative charge on Co is reversed as shown in FIG. 8F2 and explained above in the section entitled Energy Recovery.

Detailed Description of Pulse Power Components

Power Supply

Figure 8C:
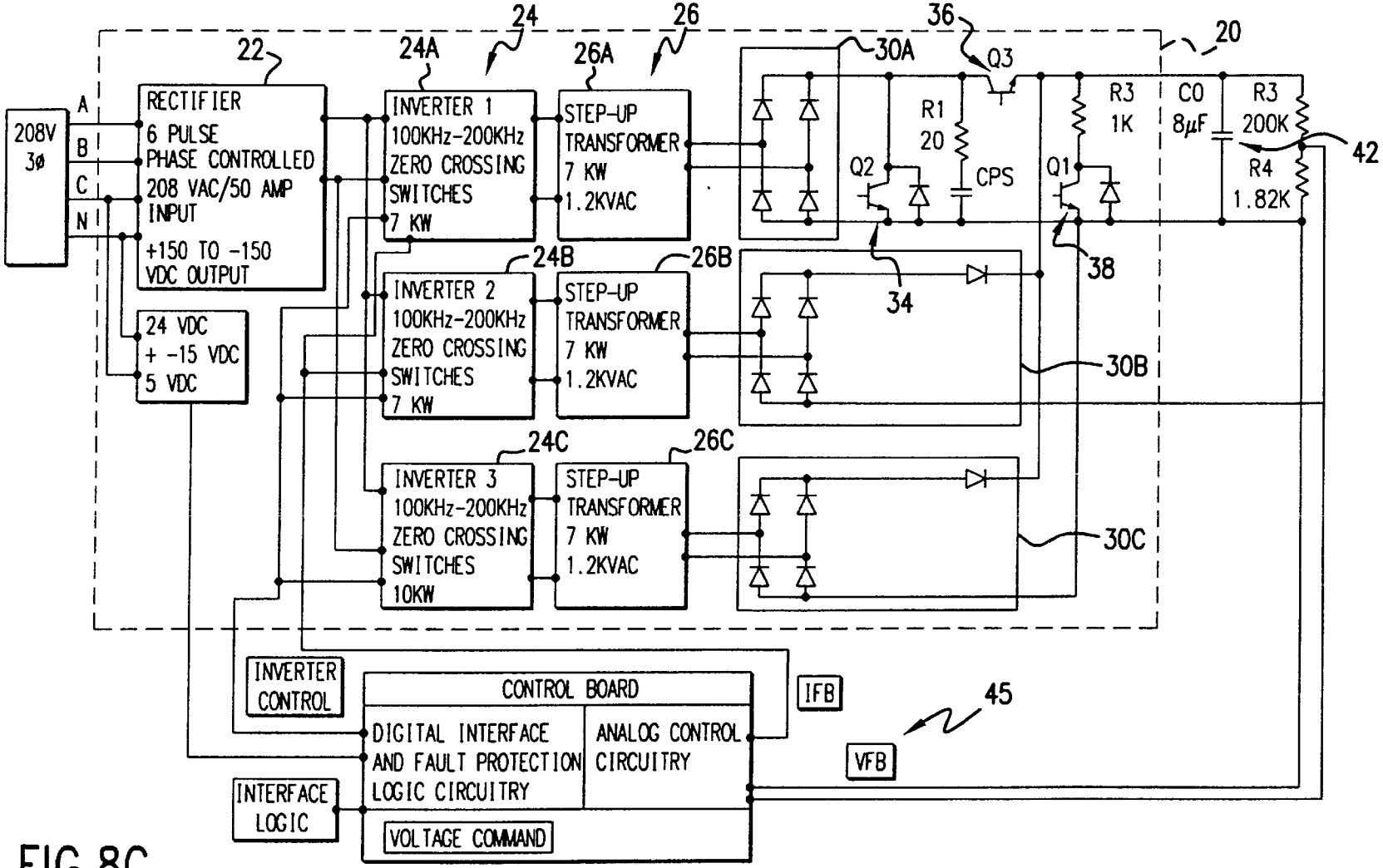
FIG. 8C is a combination block diagram, circuit diagram of a high voltage power supply which is part of the above preferred embodiment.

A more detailed circuit diagram of the power supply portion of the preferred embodiment is shown in FIG. 8C. As indicated in FIG. 8C, rectifier 22 is a 6 pulse phase controlled rectifier with a plus 150v to −150V DC output. Inverter 24 is actually three invertors 24A, 24B and 24C. Invertors 24B and 24C are turned off when the voltage on 8.1 $\mu$F Co charging capacitor 42 is 50 volts less than the command voltage and inverter 24A is turned off when the voltage on Co 42 slightly exceeds the command voltage. This procedure reduces the charge rate near the end of the charge. Step up transformers 26A, 26B and 26C are each rated at 7 kw and transform the voltage to 1200 volt AC.

Three bridge rectifier circuits 30A, 30B and 30C are shown. The HV power supply control board 21 converts a 12 bit digital command to an analog signal and compares it with a feedback signal 45 from Co voltage monitor 44. When the feedback voltage exceeds the command voltage, inverter 24A is turned off as discussed above. Q2 switch 34 closes to dissipate stored energy within the supply. Q3 isolation switch 36 opens to prevent any additional energy leaving the supply and Q1 bleed switch 38 closes to bleed down the voltage on Co 42 until the voltage on Co equals the command voltage. At that time Q1 opens.

Commutator and Compression Head

The principal components of commutator 40 and compression head 60 are shown on FIGS. 8A and 8B and are discussed above with regard to the operation of the system. In this section, we describe details of fabrication of the commutator.

Solid State Switch

In this preferred embodiment solid state switch 46 is an P/N CM 1000 HA-28H IGBT switch provided by Powerex, Inc. with offices in Youngwood, Pa.

Inductors

Inductors 48, 54 and 64 comprise saturable inductors similar to those described in U.S. Pat. Nos. 5,448,580 and 5,315,611. A top and section view of a preferred saturable inductor design is shown respectively in FIGS. 8G1 and 8G2. In the inductors of this embodiment, flux excluding metal pieces such as 301, 302, 303 and 304 are added as shown in FIG. 8G2 in order to reduce the leakage flux in the inductors. The current input to this inductor is a screw connection at 305 to a bus also connected to capacitor 62. The current makes four and one half loops through vertical conductors. From location 305 the current travels down a large diameter conductor in the center labeled 1A, up six smaller conductors on the circumference labeled 1B, down 2A, up 2B, down all of the flux excluder elements, up 3B, down 3A, up 4B and down 4A, and the current exits at location 306. Where a pot like housing 64A serves as a high voltage current lead. The "lid" 64B of the saturable inductor is comprised of an electrical insulator material such as teflon. In prior art pulse power systems, oil leakage from oil insulated electrical components has been a problem. In this preferred embodiment, oil insulated components are limited to the saturable inductors and the oil is contained in the pot-like oil containing metal housing 64A which is, as stated above, the high voltage connection output lead. All seal connections are located above the oil level to substantially eliminate the possibility of oil leakage. For example, the lowest seal in inductor 64 is shown at 308 in FIG. 8G2. Since the flux excluding metal components are in the middle of the current path through the inductor, the voltage allowing a reduction in the safe hold-off spacing between the flux exclusion metal parts and the metal rods of the other turns. Fins 307 are provided to increase heat removal.

Capacitors

Capacitor banks 42, 52 and 62 are all comprised of banks of commercially available off-the-shelf capacitors connected in parallel. These capacitors are available from suppliers such as Murata with offices in Smyrna, Ga. Applicants preferred method of connecting the capacitors and inductors is to solder or bolt them to positive and negative terminals on special printed circuit board having heavy nickel coated copper leads in a manner similar to that described in U.S. Pat. No. 5,448,580.

Pulse Transformer

Figure 8D:
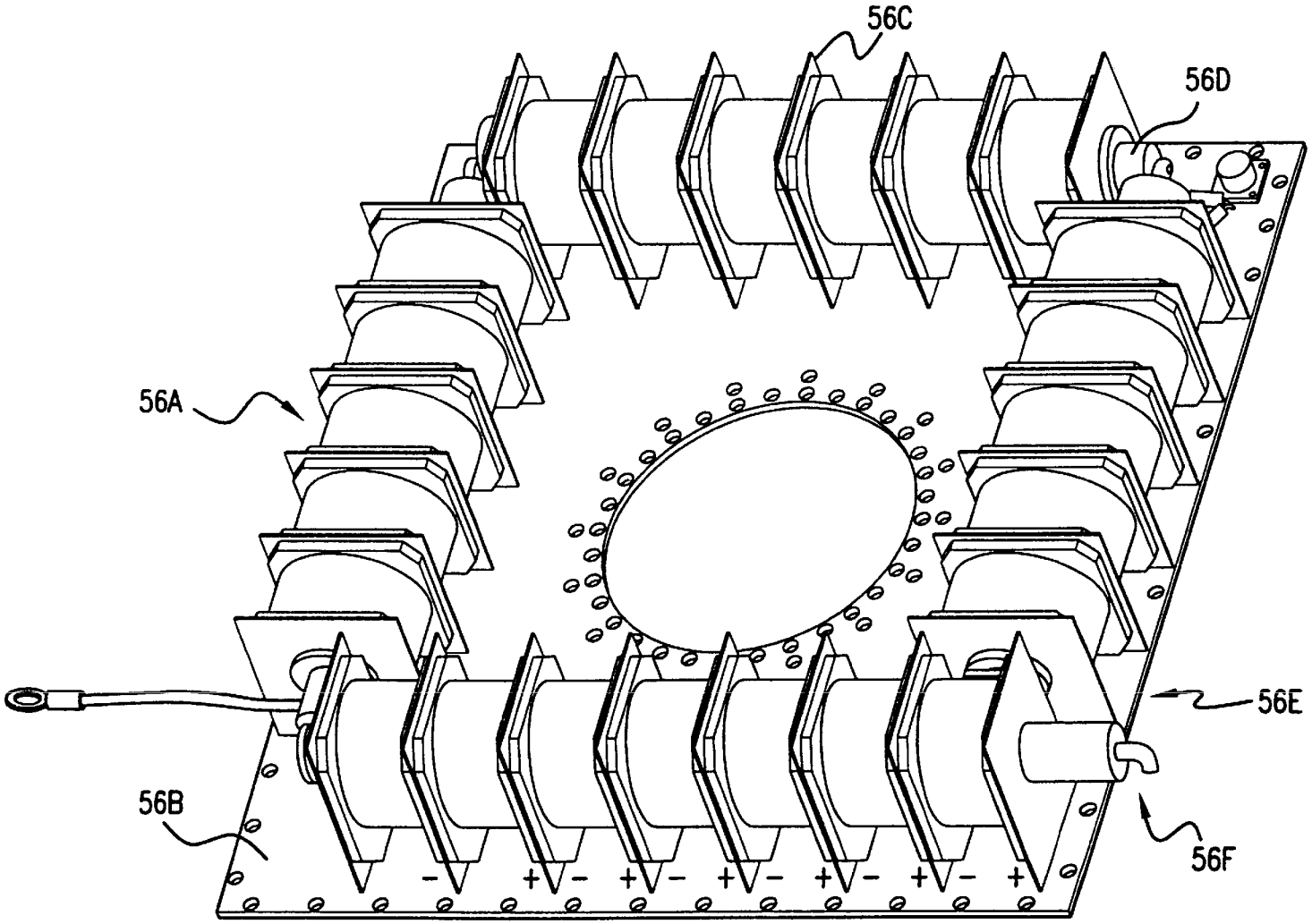
FIG. 8D is a prospective assembly drawing of a pulse transformer used in the above preferred embodiment.
Figure 8E:
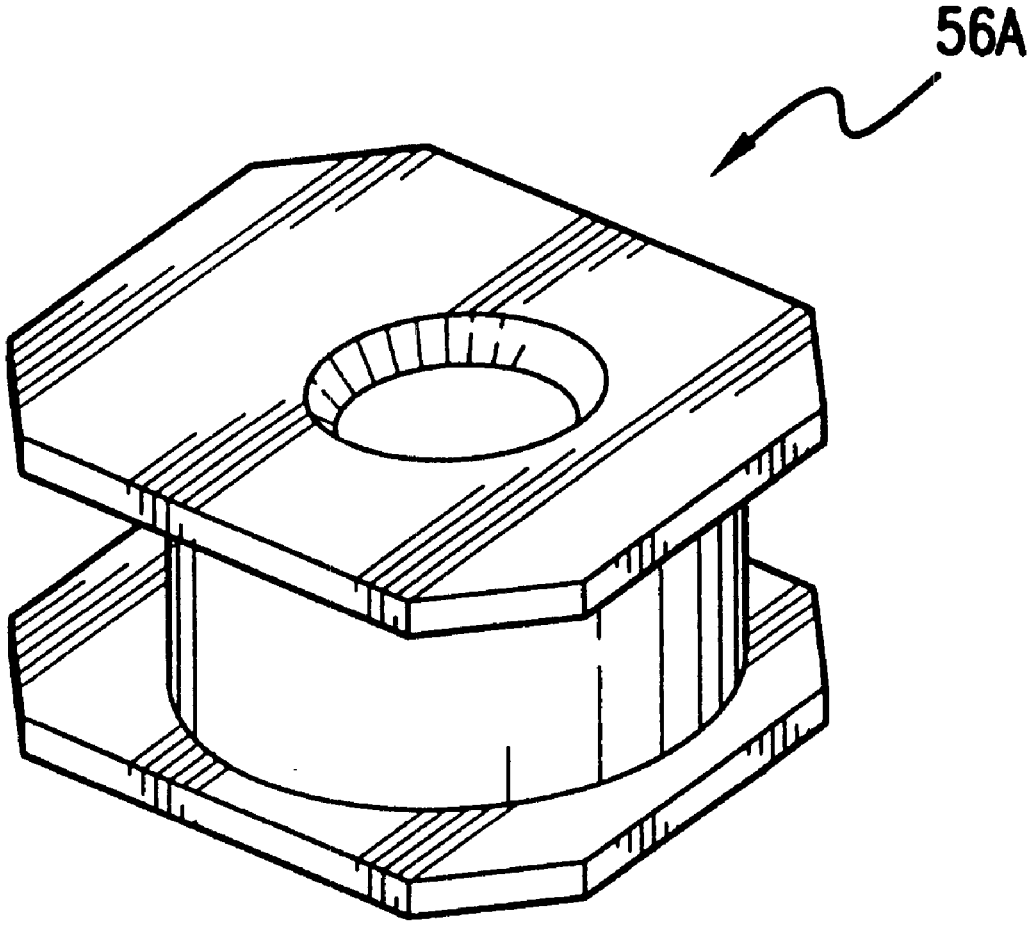
FIG. 8E is a drawing of a primary winding of a pulse transformer used in the above preferred embodiment.
Figure 9A:
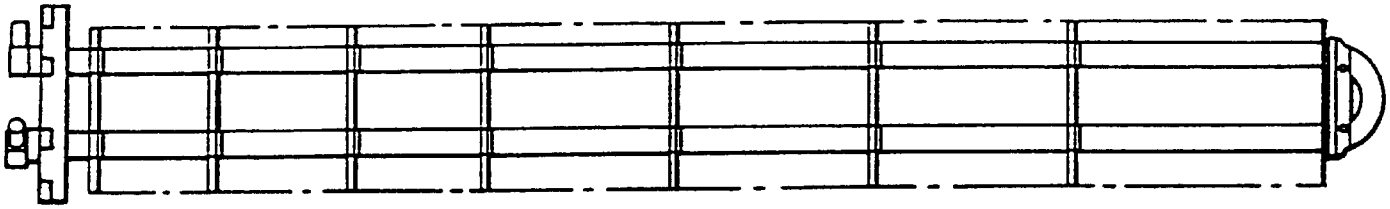
FIGS. 9A and 9B are drawings describing a preferred heat exchanger design.
Figure 9B:
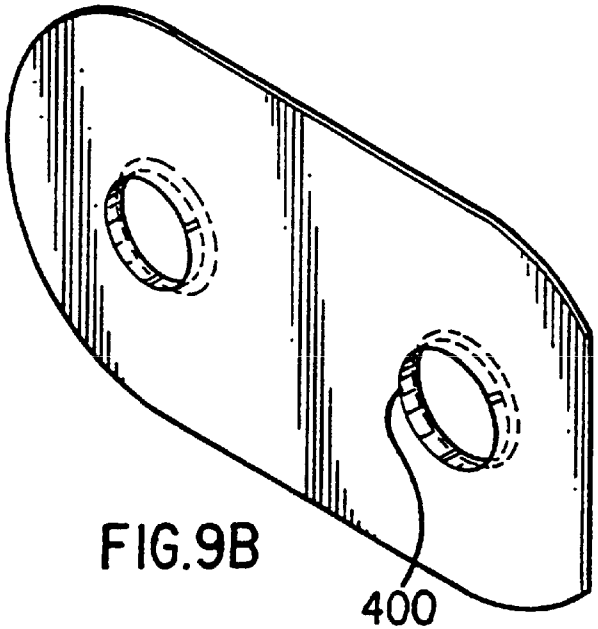

Pulse transformer 56 is also similar to the pulse transformer described in U.S. Pat. Nos. 5,448,580 and 5,313,481; however, the pulse transformers of the present embodiment has only a single turn in the secondary winding and 23 separate primary windings. A drawing of pulse transformer 56 is shown in FIG. 8D. Each of the 23 primary windings comprise an aluminum spool 56A having two flanges (each with a flat edge with threaded bolt holes) which are bolted to positive and negative terminals on printed circuit board 56B as shown along the bottom edge of FIG. 8D. Insulators 56C separates the positive terminal of each spool from the negative terminal of the adjacent spool. Between the flanges of the spool is a hollow cylinder 1 1/16 long with a 0.875 OD with a wall thickness of about 1/32 inch. The spool is wrapped with one inch wide, 0.7 mil thick Metglas™ 2605 S3A and a 0.1 mil thick myler film until the OD of the insulated Metglas™ wrapping is 2.24 inches. A prospective view of a single wrapped spool forming one primary winding is shown in FIG. 8E.

The secondary of the transformer is a single stainless steel rod mounted within a tight fitting insulating tube of electrical glass. The winding is in four sections as shown in FIG. 8D. The stainless steel secondary shown as 56D in FIG. 8D is grounded to a ground lead on printed circuit board 56B at 56E and the high voltage terminal is shown at 56F. As indicated above, a 700 volt pulse between the + and − terminals of the primary windings will produce a minus 16.100 volt pulse at terminal 56F on the secondary side for a 1 to 23 voltage transformation. This design provides very low leakage inductance permitting extremely fast output rise time.

Laser Chamber Pulse Power Components

The Cp capacitor 82 is comprised of a bank of twenty-eight 0.59 nf capacitors mounted on top of the laser chamber pressure vessel. The electrodes 83 and 84 are each solid brass bars about 28 inches long which are separated by about 0.5 to 1.0 inch. In this embodiment, the top electrode 83 is the cathode and the bottom electrode 84 is connected to ground as indicated in FIG. 8A.

Compression Head Mounting

This preferred embodiment of the present invention includes a compression head mounting technique shown in FIGS. 8H1 and 8H2. FIG. 8H1 is a side section view of the laser system showing the location of the compressor head module 60 in relation to electrodes 83 and 84. This technique was designed to minimize the impedance associated with the compression lead chamber connection and at the same time facilitates quick replacement of the compression head. As shown in FIGS. 8H1 and 8H2 the ground connection is made with an approximately 28 inch long slot tab connection along the back side of the compression head as shown at 81A in FIG. 8H1 and 81B in FIG. 8H2. The bottom of the slot tab is fitted with flexible finger stock 81C. A preferred finger stock material is sold under the trade name Multilam®.

The high voltage connection is made between a six-inch diameter smooth bottom of saturable inductor 64 and a mating array of flexible finger stock at 89 in FIG. 8H1. As above, a preferred finger stock material is Multilam®. This arrangement permits the replacement of the compression head module for repair or preventative maintenance in about five minutes.

Gas Control Module

This preferred embodiment comprises a fluorine control system which permits operation within a chosen sweet spot without the use of a fluorine monitor. This embodiment can be described by reference to FIG. 16.

Fluorine Depletion

Laser chamber 1 comprises about 20.3 liters of laser gas. Nominally as described above, the constituents are 0.1 percent fluorine, and the remainder helium at a pressure of about 4 atmospheres. The 0.1 percent fluorine represents a volume of about 0.0023 liters or 2.3 ml of fluorine at 4 atm. In mass terms the nominal amount of fluorine in the laser chamber is about 110 mg. The partial pressure of the pure fluorine is about 411 Pa, pure fluorine (corresponding to about 41 kPa of the 1% fluorine mixture). During normal operations with the laser operating at a duty factor of about 40 percent (which is typical for a lithography laser) fluorine is depleted at a rate of about 4.5 mg per hour (this corresponds to about 4% of the fluorine in the chamber per hour). In terms of partial pressure of pure fluorine, this normal depletion rate of fluorine is about 16 Pa per hour. To make up for this depletion using the 1% fluorine gas mixture, a volume of the mixture equivalent to about 1.6 kPa per hour is added to the chamber.

The fluorine depletion rate for the laser is far from constant. If the laser fan is operating but no lasing is taking place the fluorine depletion rate is cut approximately in half. If the fan is shutdown the fluorine depletion rate is cut to about ¼ the 40% duty factor depletion rate. At 100% duty factor the depletion rate is about double the 40% duty factor depletion rate.

Gas Replacement

The process described above basically replaces depleted fluorine on an almost continuous basis. Since the fluorine gas source is only 1% fluorine it also replaces a portion of the He in the chamber on an almost continuous basis. Nevertheless, even through a portion of the laser gas is being substantially continuously replaced, operation in this mode results in a build up of contaminants in the laser gas which reduces the efficiency of the laser. This reduction in efficiency requires an increase in the voltage and/or an increase in the fluorine concentration to maintain the desired pulse energy. For this reason, normal practice with prior art systems suggest that periodically the laser be shutdown for a substantially complete gas exchange. This substantially complete gas exchange is referred to as a refill. These periods may be determined based on number of laser pulses such as 100,000,000 pulses between refills, or refill times may be determined based on calendar time since the last refill or a combination of pulses and calendar time. Also the refill times may be determined by the magnitude of the charging voltage needed for a desired output at a particular fluorine concentration. Preferably after a refill a new test for the "sweet spot" should be run. Also, periodically in between fills the sweet spot test should be performed so that if the sweet spot changes the operator will know where the new sweet spot is.

Figure 16:
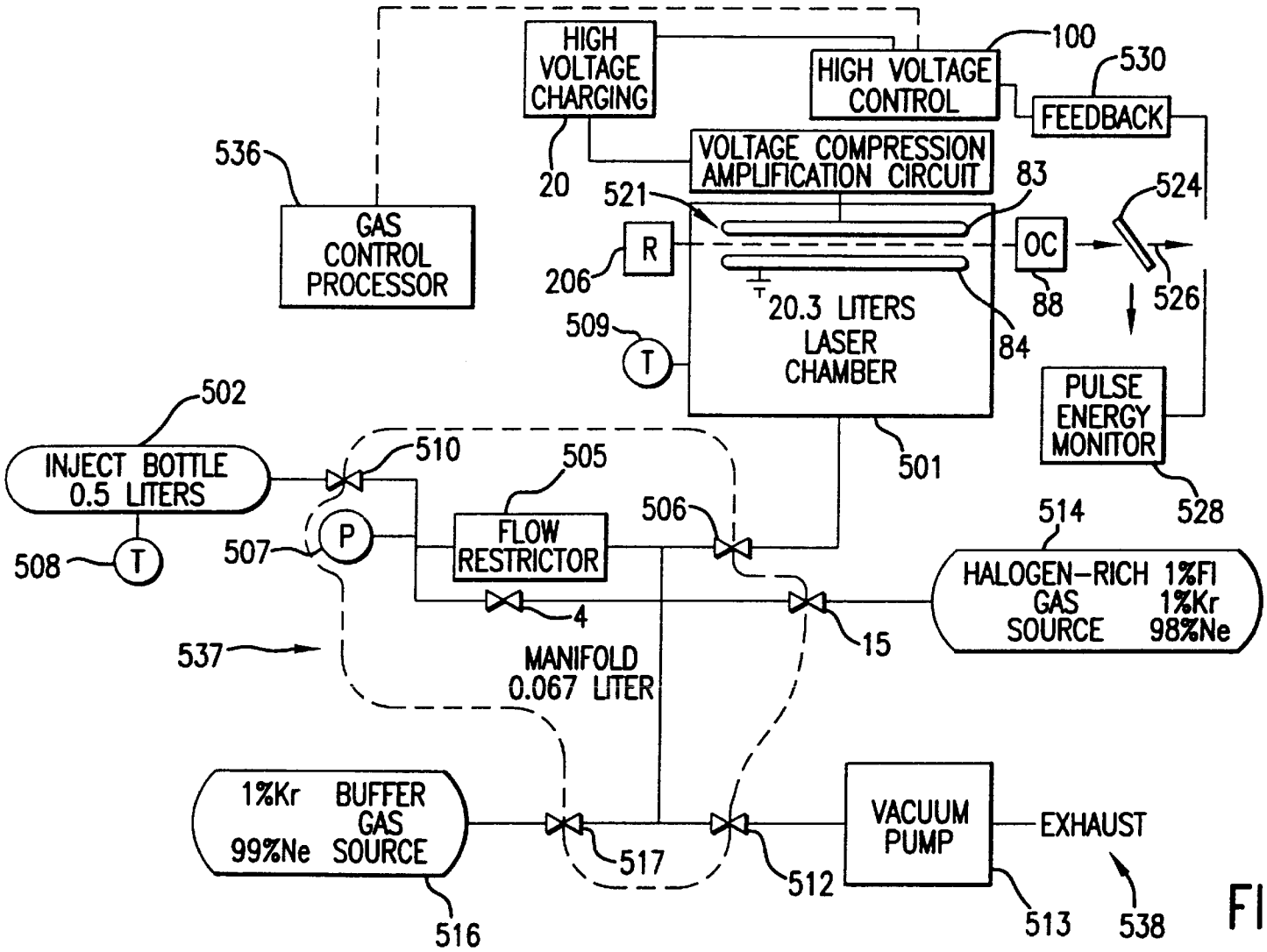
FIG. 16 shows a big manifold gas supply system.

A refill may be accomplished using the system shown in FIG. 16 as follows. With valves 510, 506, 515, 512, 517, and 504 closed, valves 506 and 512 are opened, vacuum pump 513 is operated and the laser chamber is pumped down to an absolute pressure of less than 13 kPa. (A direct pump down line may be provided between the chamber 1 and vacuum pump 513 to permit a quick pump down.) Valve 512 is closed. Valve 516 is opened and 100% He buffer gas from buffer gas bottle 516 is added to the chamber to fill it to a pressure equivalent to 262 kPa at 50° C. (Note that for this 20.3 liter laser chamber, temperature correction can be approximated using a $\Delta P/\Delta T$ correction of 1 kPa/° C. for a chamber temperature deviation from 50° C. So if the chamber temperature is 23° C. it would be filled to 247 kPa.) Valve 517 is closed and valve 515 is opened and a quantity of the 1% Fl. 99% He mixture from halogen rich gas bottle 514 is added to chamber 1 to fill it to a pressure equivalent to 290 kPa at 50° C. (Note a temperature correction should be used.) This will produce a gas mixture in the chamber of approximately 0.1% Fl and 99% He. When the chamber is heated to about 50° C. the pressure will be about 4 atm.

$N_2$ Purge System

Because $O_2$ strongly absorbs 157 mn light, $O_2$ must be excluded from the beam path. Applicants have developed an $N_2$ purge system that is greatly improved over prior art systems. All optical components associated with the laser that are outside the chamber are purged with nitrogen. This nitrogen system is operated at a pressure that is during operation of the laser only about 10 pascals in excess of atmospheric pressure. This small pressure differential is preferred to avoid a pressure distortion effect on the optical components. Components purged include the line narrowing module, the output coupler, the wavemeter and the shutter assembly.

Seals are provided at all potential leakage sites output ports connecting of 1/16-inch id. tubes about 6 feet long are provided. The flow through the output ports is monitored to assure proper functioning of the purge system. Preferred flow rates of about 41/minute through the 1/16-inch id. 6-foot long tube is preferred flow rate to correspond to the desired $N_2$ pressure differential.

Laser Component Cooling

Figure 13:
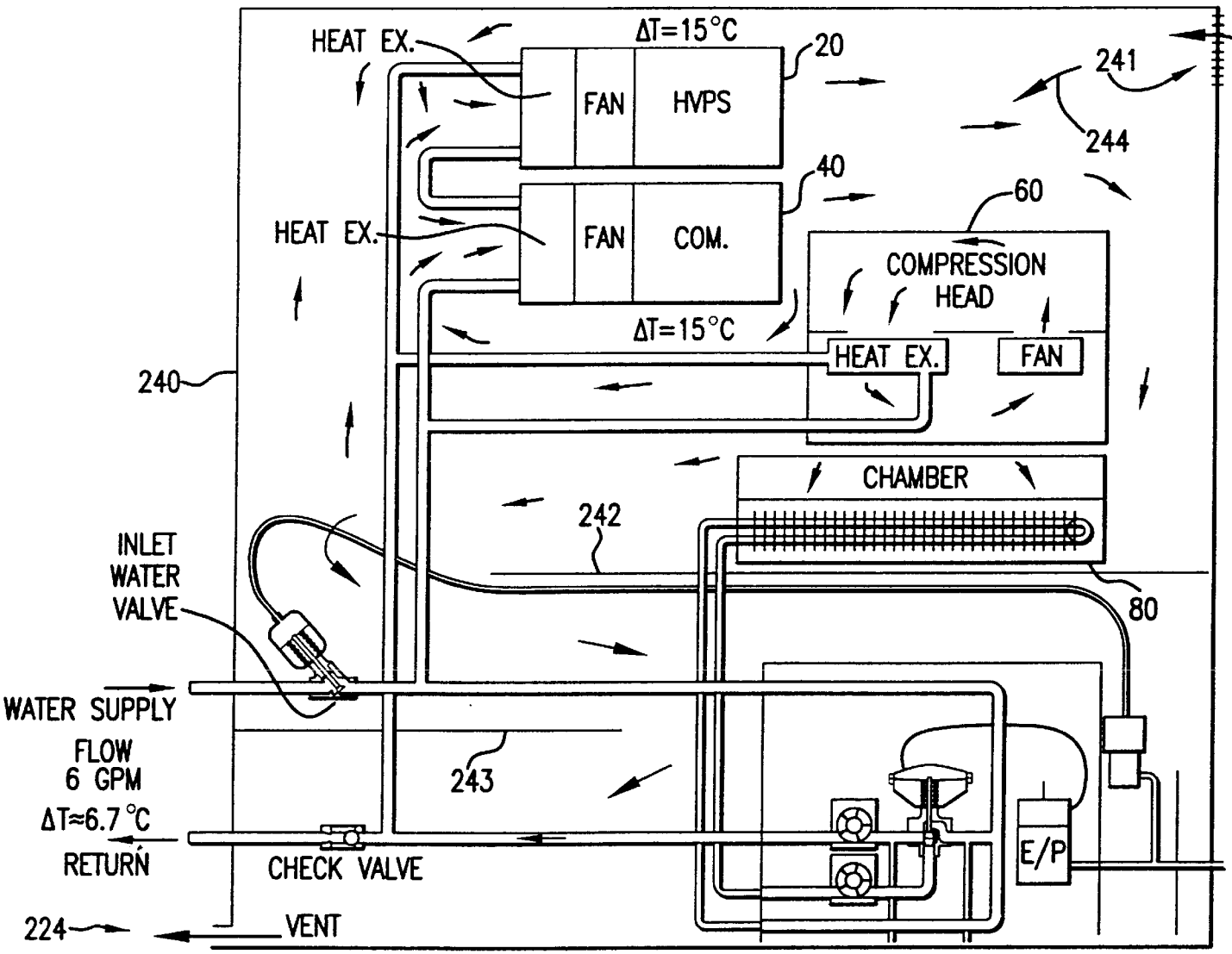
FIG. 13 describes a preferred enclosure cooling system.

Preferred embodiments of the present invention which is especially useful for operation at repetition rates in excess of 1000 to 2000 Hz, includes a unique cooling technique shown in FIG. 13 for cooling an excimer laser.

Components of the laser are contained in enclosure 240 which is maintained on the inside at a slight vacuum produced by a blower mounted in a vent as shown at 224 in FIGS. 13 and 4A. The cabinet comprises filtered intake port 241 near the top of the cabinet and a few small leakage sources, such as around gasketed doors, so that the flow of room air through the laser enclosure is about 200 $ft^3$/min which is not nearly sufficient to remove the heat produced by heat producing components of the laser.

The very great majority (roughly 90 percent) of the waste heat produced by the laser (roughly 12 kw at 100% duty factor) is removed by a chilled water system as shown in FIG. 13.

In this embodiment the major heat sources in the laser are the high voltage supply 20, the commutator 40, the compression head 60 and the laser chamber 80. For the chamber a water cooled heat exchanger is located inside the chamber and heat is transferred from circulating laser gas to the heat exchanger to the cooling water. Another heat exchanger (not shown) is mounted on an outside surface of the chamber. For the rest of the major heat producing components cooling water is piped to the location of the component and one or more fans force air through a water-to-air heat exchanger onto the component as shown in FIG. 13. For the compression head the circulation is contained as shown, but for the HVPS and the commutator the circulation is onto the component then through other portions of the enclosure to also cool other components before being recirculated back to the heat exchangers.

Dividing pans 242 and 243 guide the general ventilation air from filter 241 through a path shown by open headed arrows 244 to vent 224.

This cooling system contains no ducts and except for a water line feeding the heat exchangers inside of and attached to the laser chamber there is no water line connection to any laser component. Since all components (other than the laser chamber) are cooled by air blown about inside the enclosure, there are no cooling connections to make a break when installing and replacing components. Also, the lack of need for ducting greatly increases useable components and working space inside the enclosure.

Pulse Energy Control Algorithm

Mode of Operation—Chip Lithography

The embodiment of the present invention includes a computer controller program with a new algorithm, which substantially reduces prior art variations in pulse energy and total integrated burst energy. The improved equipment and software and a preferred process for reducing energy sigma and burst dose variation is described below.

As stated in the background section of this specification, the burst mode is a typical mode of operation of an excimer laser used for the light source of a stepper machine in the lithographic production integrated circuits. In this mode the laser is operated to produce "a burst" of pulse at the rate of 1000 Hz for about 110 milliseconds to produce 110 pulses to illuminate a section of a wafer. After the burst the stepper moves the wafer and the mask and once the move is complete which takes typically a fraction of a second the laser produces another 110 pulse burst. Thus, normal operation is bursts of about 110 milliseconds followed by dead times of a fraction of a second. At various times, longer dead time periods will be provided to that other operations can be performed. This basic process continues 24 hours a day, 7 days per week, for several months with the laser typically producing several millions of bursts per day. In the above burst mode, it is usually important that each section of the wafer received the same illumination emerge on each burst. Also, chip makers want the pulse to pulse variation to be minimized.

This preferred embodiment of the present invention accomplishes these objectives with equipment and software which monitors the energy of each pulse (pulse N-1) then controls the energy of the next pulse (pulse N) based on the results of a:

1) a comparison of the measured energy of pulse N-1 with a target pulse energy and
(2) a comparison of the accumulated dose of the burst through pulse N-1 to a target pulse dose through pulse N-1.

In the typical $F_2$ excimer laser we have been discussing the energy of the first 30–40 ms of a burst in typically less stable than the rest of the burst due to transient effects in the laser gas. After about 40 ms following the first pulse, the pulse energy at constant voltage is relatively constant. In dealing with these early perturbations. Applicants have separated the burst into two time-wise regions, the first region (consisting of a number of the earlier pulses, for example, 40 pulses) called the "K" region and a second region (consisting of the pulses which follow the K region) which Applicants, in this specification, refer to as the "L" region.

This embodiment of the present invention utilizes prior art excimer laser equipment for pulse energy control. Pulse energy of each pulse of each burst is measured by photodiode 92 as shown in FIG. 8A. The overall response time of this photodiode and its sample and hold circuit, including time required to reset the circuit, is less than substantially less than 500 microseconds. The accumulated signal resulting from each approximately 15 ns pulse is stored a few microseconds after the pulse is over and this signal is read six times and the average is stored by computer controller 22 approximately 1.0 microsecond after the beginning of the pulse. The accumulated energy of all the previous individual pulses in a burst is referred to as the burst dose value. Computer controller utilizes the signal representing the pulse energy of pulse N along with target pulse energy and the burst dose value in order to specify the high voltage for the pulse N+1. This calculation requires about 200 microseconds. When the value of high voltage for N+1 is determined, computer controller sends a signal to the high voltage command (VCMD) of the high voltage power supply as shown in FIG. 8A establishing the charging voltage for pulse N+1 that takes a few microseconds. Computer controller commands the high voltage power supply to charge up capacitor Co to the specified voltage. (At high repetition rates in excess of 2000 Hz it may be desirable to start the charging before the calculation is complete.) The charging requires about 250 microseconds so that Co is fully charged and ready to go when it receives a trigger signal for pulse N+1 from trigger circuit 13 as shown in FIG. 2 at 0.5 millisecond after the trigger signal from pulse N. On the trigger signal, capacitor $C_0$ discharges its approximately 700 volts into the magnetic compression circuit shown in FIG. 8B over a period of about 5 microseconds and the pulse is compressed and amplified by the magnetic compression circuit to produce a discharge voltage on capacitor Cp of about 16,100 volts which discharges across electrodes 6 in about 100 ns producing a laser pulse of about 10 mJ and about 15 ns in duration.

Preferred Algorithm

A special preferred process for adjusting the charging voltage to achieve substantially desired pulse energies when operating in a burst mode is described below.

The process utilizes two voltage adjustment algorithms. The first algorithm applies to the first 80 pulses and is called the KPI algorithm. The second algorithm called the PI algorithm applies to pulses after pulse number 40. This time period after the $80^{th}$ pulse is herein called the "L region" of the burst. The initials "PI" refer to "proportional integral" and the "K" in "KPI" refers to the "K region" of the burst.

KPI Algorithm

The K region comprises pulses 1 through k, where k=40 for this preferred embodiment. The algorithm for setting the charging voltage for pulse N is:

$$V_N=(V_B)_N-(V_C)_{N-1} N=1,2, \ldots k$$

where:

$V_N$=charging voltage for N'th pulse $(V_B)_N$=an array of k stored voltages which represent the current best estimate of the voltage required to produce the target energy $E_T$ for the N'th pulse in the K region. This array is updated after each burst according to the equation below.

$(V_C)_{N-1}$=a voltage correction based the energy error of the previous pulse and on the energy errors which occurred for the previous pulses in the burst, up to pulse N-1

$$\sum_{i=1}^{N-1} \frac{(A \cdot r_1 + B \cdot D_t}{({}_tlE/{}_t lV)}$$

By definition, $(V_c)_o=0$

A,B=fractions typically between 0 and 1, which in this preferred embodiment both A and B are 0.5

$\epsilon_i$=the energy error of the i'th pulse $=E_i-E_T$, where $E_i$ is the energy for the i'th pulse, and $E_T$ is the target energy $D_i$=the cumulative dose error of the burst, including all pulses from 1 through i $$\sum_{k=1}^{i} \epsilon_k$$

dE/dV=a rate of change of pulse energy with charging voltage. (In this embodiment, one or more values of dE/dV is determined experimentally during each burst and a running average of these values is used for the calculation)

The stored values (VB)N are updated during or after each burst according to the following relation:

$$(V_B)_N^{M+1} = (V_B)_N^M - C \cdot \left(\frac{\epsilon_N}{dE/dV} - (V_C)_N\right),$$

where the index M refers to the burst number

C=a fraction typically between 0 and 1, which in this preferred embodiment is 0.3.

PI Algorithm

The L region comprises pulses k+1 to the end of the burst (for a preferred embodiment, pulse numbers 41 and higher). The algorithm for setting the charging voltage for pulse N is:

$$V_N = V_{N-1} - \frac{(A \cdot \epsilon_{N-1} + B \cdot D_{N-t})}{(dE/dV)} N = k+1, K+2, \ldots$$

where:

$V_N$=charging voltage for N'th pulse $V_{N-1}$=charging voltage for N−1'st (previous) pulse The variables A, B, $\epsilon_i$, $D_1$, and dE/dV are defined as before.

Determination of dE/Dv

A new value for dE/dV is determined periodically, in order to track the relatively slow changes in the characteristics of the laser. In the preferred embodiments, dE/dV is measured by varying or dithering the voltage in a controlled manner during two successive pulses in the L region. For these two pulses, the normal PI energy control algorithm is temporarily suspended and replaced by the following:

For pulse j:

$$V_j = V_{j-1} - \frac{(A \cdot \epsilon_{j-1} + B \cdot D_{j-1})}{(dE/dV)} + V_{Dither}$$

where $V_{Dither}$=a fixed voltage increment, typically a few volts

For pulse j+1:

$$V_{j+1}=V_j-2.V_{Dither}$$

After pulse j+1, dE/dV is calculated:

$$dE/dV = \frac{(E_{j+1} - E_j)}{2 \cdot V_{Dither}}$$

The calculation of dE/dV can be very noisy, since the expected energy changes due to the dithering voltage can be of the same magnitude as the normal energy variation of the laser. In the preferred embodiment, a running average of the last 50 dE/dV calculations is actually used in the PI and KPI algorithms.

The preferred method for $V_{Dither}$ choosing is to specify a desired energy dither $E_{Dither}$, typically a few percent of the energy target $E_T$, and then use the current (averaged) value for dE/dV to calculate $V_{Dither}$:

$$V_{Dither} = \frac{E_{Dither}}{(dE/dV)}$$

Pulse j+2 (immediately following the two dithered pulses) is not dithered, but has the special value:

$$V_{j-2} = V_{j-1} + V_{Dither} - \frac{(A \cdot (\epsilon_{j+1} + E_{Dither}) + B \cdot D_{j+1})}{(dE/dV)} (\text{pulse } j+2)$$

This special value for $V_{j+2}$ is corrected for both the applied voltage dither and the expected energy dither from pulse j+1.

Many variations on the algorithm described above are possible. For example, dE/dV can be determined in the L region as well as the K. The dithering can be performed once per burst, or several times. The dithering sequence may be performed at a fixed pulse number j as described above, or it may be initiated for a randomly chosen pulse number which varies from one burst to the next.

The reader should recognize that A, B and C are convergence factors, which could have many other values. Higher values than those specified above could provide quicker convergence but could lead to increased instability. In another preferred embodiment, $A=\sqrt{2B}$ . This relationship is developed from a recognized technique to produce critical damping. B could be zero in which case there would be no dose correction; however, A should not be zero because it provides a dampening term for the dose conveyance portions of the algorithm.

If the determined value of dE/dV becomes too small the above algorithm could cause over correction. Therefore a preferred technique is to arbitrarily double dE/dV if the energy sigma value exceeds a threshold. Default values of V and dE/dV are provided for the first pulse of a burst. D is set to zero at the start of each burst. The default dE/dV is set at about three times the expected dE/dV to avoid initial over correction.

An alternate method for determining dE/dV without the dither referred to above is to merely measure and store the energy and voltage values during laser operation. (Measured rather than specified voltage values can also be used.) These data can be used to determine dE/dV as a function of V for constant pulse energy. The reader should note that each individual value of dE/dV would contain fairly large uncertainties because the elements of the value are differences of measurements having significant uncertainties. However, averaging large number of dE/dV values can reduce these uncertainties. The dither exercise to determine dE/dV does not have to be made on each burst but instead could be done periodically such as once every M bursts. Or the measurement of dE/dV could be replaced by a calculation performed by the computer or the value of dE/dV could be inserted manually by the operator of the previous pulse for the calculation of $V_{N+1}$. An alternate approach would be to use the actual measured value for $V_N$ for this control system. Also the value of $V_{BIN}$ are calculated from specified values, not actual measure values in the above-described embodiment. An obvious alternative would be to use measured voltage values. $E_T$ is normally a constant value such as 10 mJ but it does not have to be constant. For example, $E_T$ of the last ten pulses could be smaller than the nominal pulse energy so that percentage deviations from target $E_T$ for these pulses would have a smaller effect on the integrated pulse dose. Also, it may be preferable in some situations to program computer controller 22 to provide $E_T$ values that vary from burst to burst.

Single Line and Narrow Line Configurations

Figure 11A:
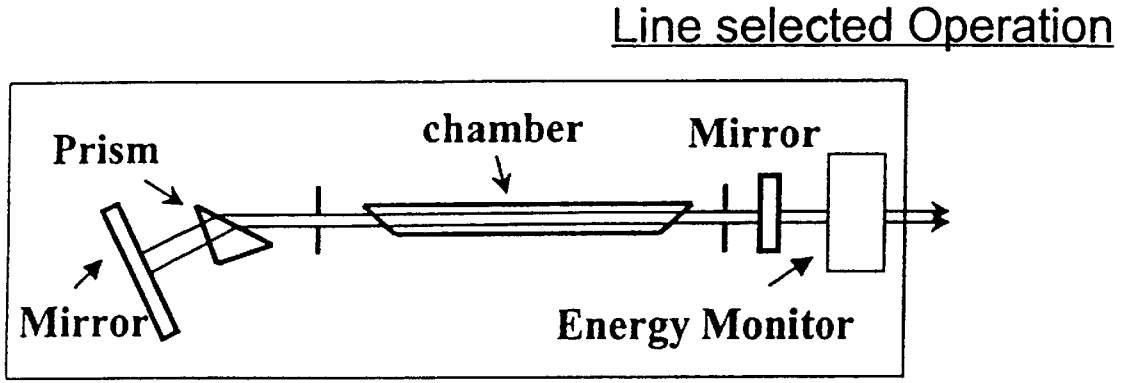
FIGS. 11A and 11B show two preferred $F_2$ system configurations.
Figure 11B:
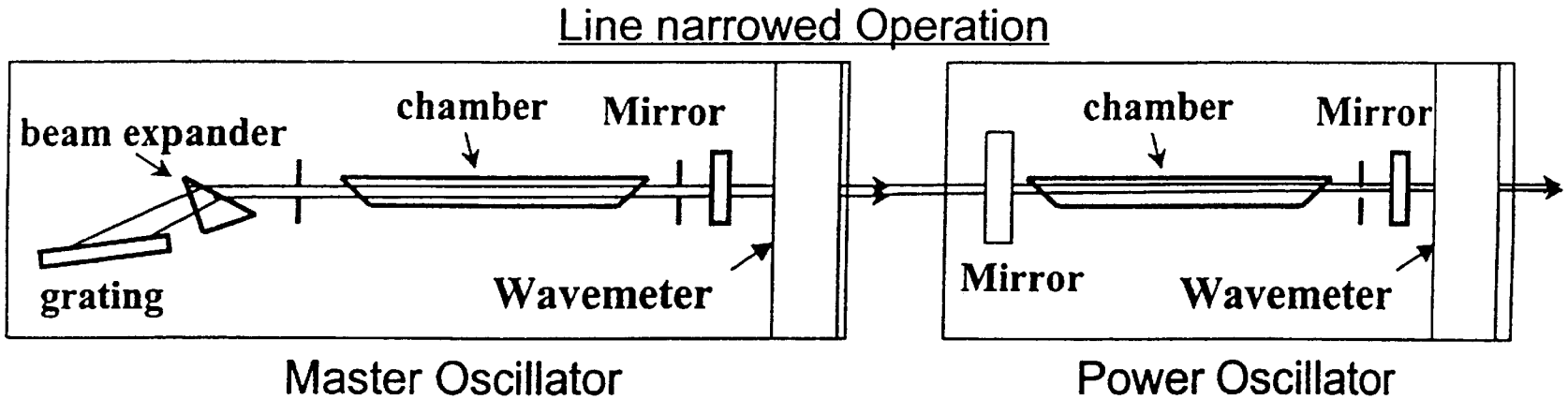
Figure 12A:
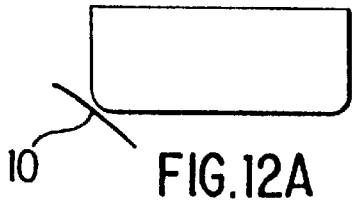
FIGS. 12A through 12E show various anode support bar designs.
Figure 12B:
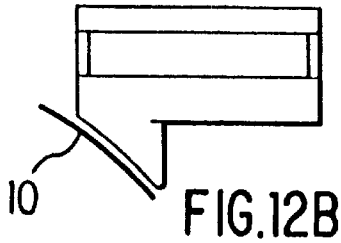
Figure 12C:
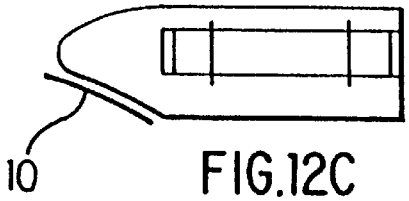
Figure 12D:
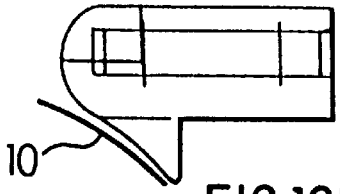
Figure 12E:
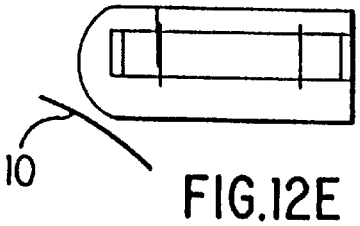

FIG. 11A shows a preferred single line configuration for a preferred $F_2$ laser system. In this configuration one of two major F2 lines is selected with a simple prism selector as shown in the figure. FIG. 11B shows a preferred line narrowed system in which a power oscillator is seeded by a master oscillator.

Prototype Unit

A prototype $F_2$ laser system unit was built and tested by Applicants and their fellow workers.

The prototype laser is largely based on current production KrF and ArF lasers incorporating several important improvements over prior art excimer laser systems, utilizing a high efficiency chamber and solid-state pulsed power excitation. The discharge is corona pre-ionized to minimize gas contamination. The entire optical beam path is nitrogen purged to avoid light absorption by oxygen and to avoid damage to optical components. All resonator optics were external to the angled chamber window equipped laser chamber. The gas mixture was 0.1% fluorine in 4 atmospheres of helium and the electrode gap was reduced to 10 mm.

With this unit, Applicants have successfully demonstrated the key parameters for a prototype lithography fluorine laser with only few straight-forward changes in an ArF laser currently in development.

Experimental Results

Experimental results from experiments with the prototype unit are described below. The laser power was measured by a standard power meter and cross-correlated with a piezoelectric Joulemeter. Contributions of the red, atomic fluorine laser were subtracted and usually amounted to less than 1% of the total energy. By venting the beam delivery tubes to air, which strongly absorbs 157 nm light, the red radiation could be measured.

The laser wavelength in this prototype unit was operated in single-line mode at 157.6 nm by tuning with a set of two external prisms. The laser could also be tuned to the 157.5 nm transition line with reduced efficiency. The transition at 156.7 run was not observed. The laser spectrum as recorded by a 2 meter Jobin Yvon VUV spectrometer indicates a measurement-limited linewidth of 6 pm.

In broadband (or multi-line) operation a maximum power of 12 W was obtained at a repetition rate of 1000 Hz. The power increased linearly with repetition rate without signs of saturation. The behavior in single line mode was similar, but at one third of the energy. This energy decrease is due to a large cavity length increase in the present prism set-up and can be significantly reduced. In burst mode a 3 sigma stability of 5% was recorded. Only a benign burst transient on the output energy was observed. This compares favorably to ArF lasers which show larger energy instability and a gas flow related burst transient. From this one can conclude that a production fluorine lithography laser will have even better energy stability than present day ArF lasers. The integral square pulse duration was 30 ns which is approaching the performance of ArF lasers.

Careful selection of laser chamber materials and preionization by a corona discharge enabled laser operation without cryogenic purification and without halogen injection over a period of several hours and 3 M shots with minimal energy degradation.

Figure 10A:
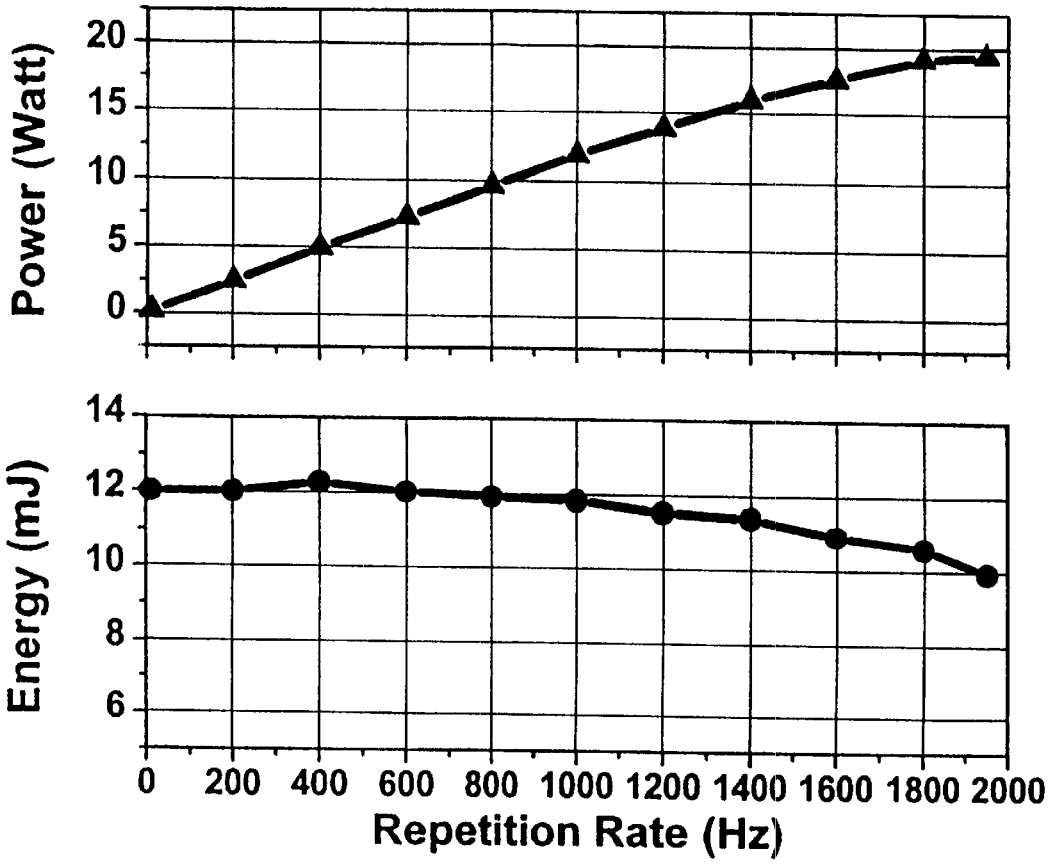

The dependence of broadband laser power upon repetition rate is displayed in the top portion of FIG. 10A. The bottom portion of FIG. 10A shows a slight drop off of pulse energy with increasing repetition rate above 1000 Hz. The laser power increases almost linearly with repetition rate up to a power of 15 W at 1 kHz and about 19 W at 2000 Hz. Based on this linear relationship one can assume that the fluorine laser can be scaled further to several kilohertz operation, providing the gas flow is scaled accordingly. Since Applicants are using helium as a buffer gas, only a fraction of the blower power of standard neon based lasers is required and therefore does not present a limitation to higher flow speeds.

Figure 10C:
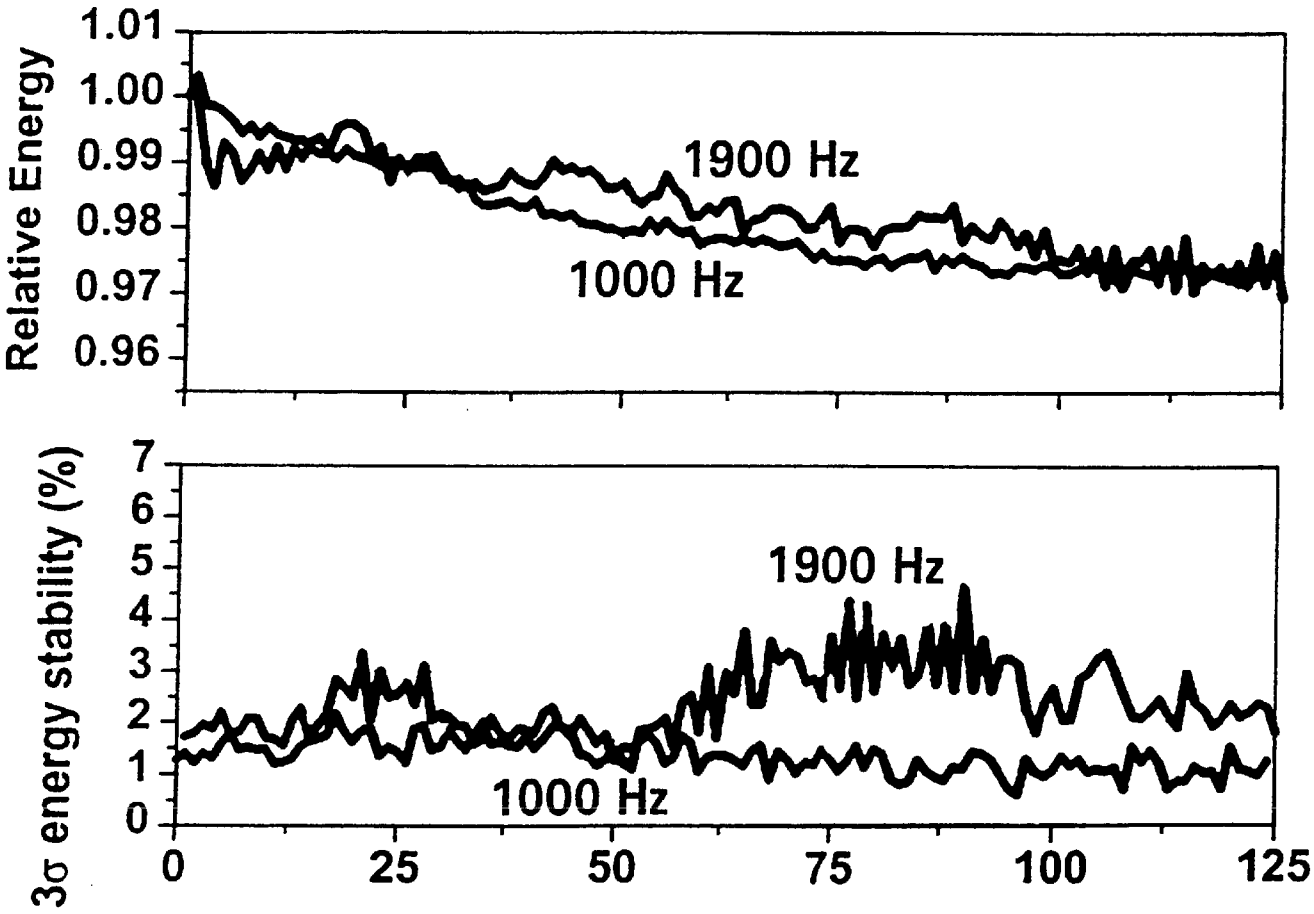

A good measure for energy stability is gained by observing the energy transient in burst mode. For this the laser is repeatedly fired in bursts and the average energy for every pulse position in the burst is recorded. Also, for every pulse number in the burst the average variation in energy from burst to burst is calculated. The resulting energy and stability curves for the fluorine laser and for comparison also for a line-narrowed ArF laser are displayed in FIGS. 10B1 and 2. The fluorine laser exhibits only minor energy variations over a 120 shot burst. The energy stability shows an initial increase in the beginning of the bursts and then stabilizes on a 3 sigma level of about 3%. By contrast the ArF laser exhibits a large transient in the energy and a 3 sigma instability around 7%. The ArF laser obtained a dose stability of 0.5% in a 60 pulse window, therefore the fluorine laser is expected to deliver at least the same dose stability. FIG. 10C comprises pulse energy and 3σ values at 1000 Hz and 1900 Hz.

A spectrum of the broadband fluorine laser as recorded by VUV spectrometer is shown in FIGS. 10D1 and 2. Clearly visible are the two transition lines at 157.52 nm and at 157.63 nm, 87% of the laser energy is located in the longer wavelength line at 157.63 nm. The transition at 156.7 nm was not observed. Single-line mode operation at 157.63 nm was achieved by tuning with a set of two external prisms. The laser could also be tuned to the 157.52 nm transition line, but at reduced efficiency. Also shown in FIGS. 10D1 and 2 is an expanded view of the laser line at 157.63 nm. Convolved linewidths of 1.14 pm FWHM and 2.35 pm 95% were measured. These linewidths are much narrower than previously expected. Therefore, a line selected fluorine laser without additional line-narrowing will be sufficient for all but fully refractive imagine systems. The laser power vs. repetition rate behavior of the single line laser exhibits the same linear rise as the broadband laser. However, the maximum power in this initial experiment was limited to 4 W. The reduced output power was caused by reflection losses in the line selection optics and by an overly long cavity length.

The horizontal and vertical beam profiles were measured at 1 m distance from the laser. (See FIGS. 10E and 2). The beam shows smooth profiles with a high degree of symmetry. These kinds of profiles are easily managed by currently used homogenizer technology to produce very uniform illumination.

Figure 10F:
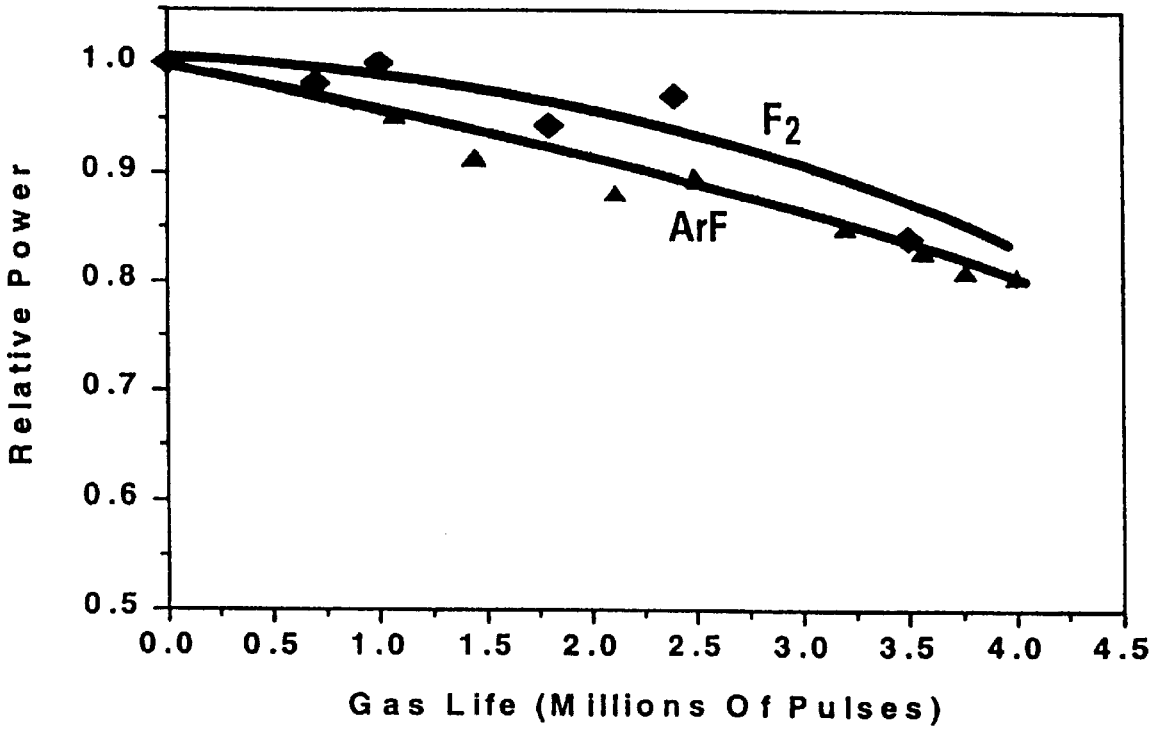

As estimation of the gas lifetime is derived by operating the fluorine laser at constant voltage without fluorine injection and recording the evolution of laser power versus the number of shots. No cryogenic purification was used in these measurements. As evident in FIG. 10F, the laser power decreases by less than 20% after 4 million laser shots, which is at least as good as for comparable ArF lasers. From previous experience with ArF lasers one can thus estimate a gas lifetime of about 25 million shots by making use of periodic fluorine injections. This is clearly a result of the choice of compatible materials in the laser chamber and the use of corona pre-ionization. For KrF and ArF lasers a direct correlation between fluorine consumption and chamber lifetime has been established, previously. We can therefore estimate a chamber lifetime of the fluorine laser on the same order as that of an ArF laser.

Figure 15A:
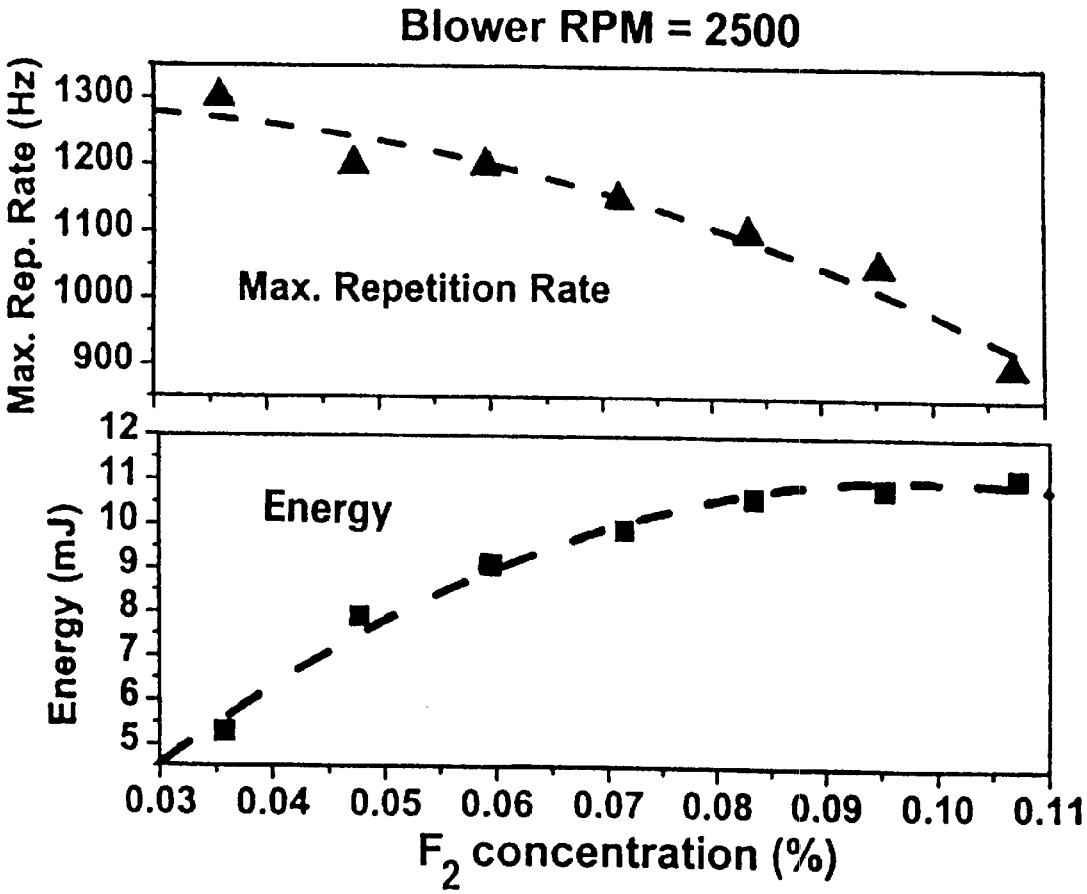
FIGS. 15A and 15B show $F_2$ laser performance data.
Figure 15B:
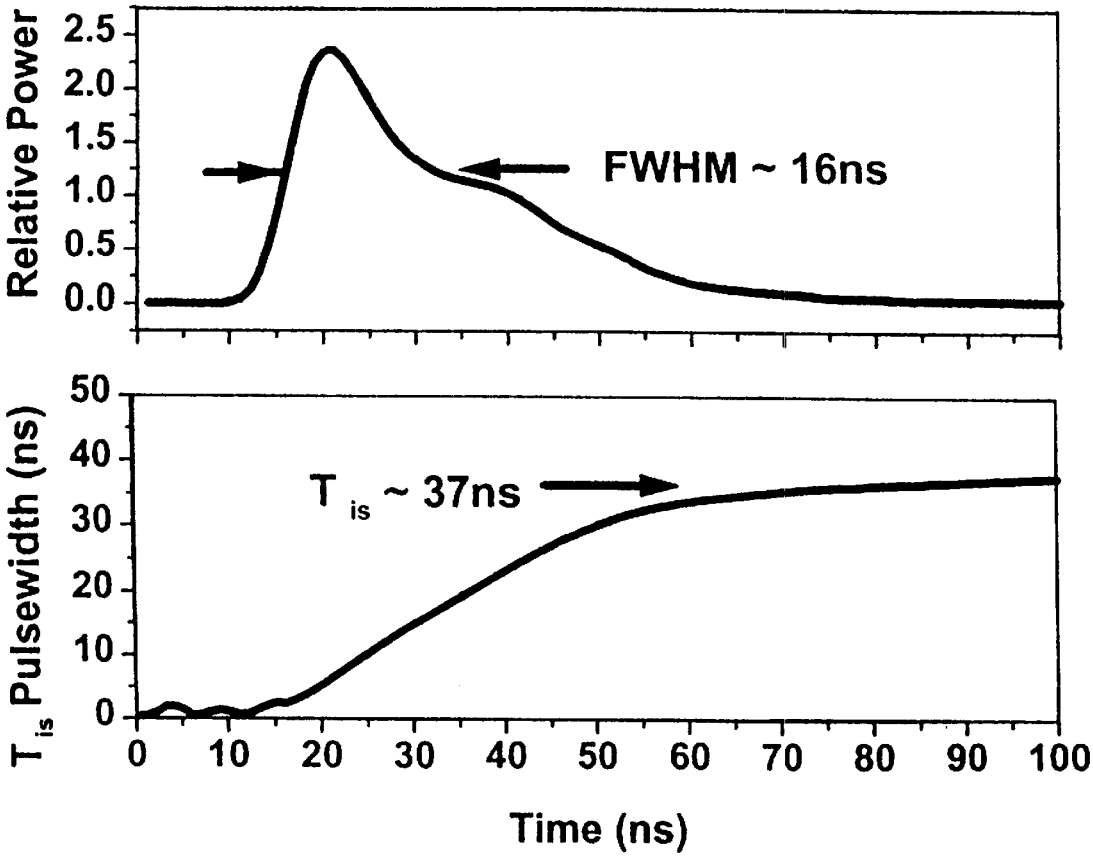

FIG. 15A bottom graph shows pulse energy versus $F_2$ concentration and the top graph shows the maximum pulse repetition rate, both at a blower speed of 2500 rpm. FIG. 15B top graph shows pulse shape as function of time indicating a FWHM of 16 ns, and the bottom graph shows that the integrated square pulse width is about 37 ns.

Although this $F_2$ laser system has been described with reference to a particular embodiment, it is to be appreciated that various adaptations and modifications may be made. For example, many alternative embodiments are discussed in the patent applications listed in the first sentence of this specification, all of which have been incorporated herein by reference. An etalon output coupler could be used to provide additional line narrowing. The buffer gas could be neon instead of helium. The invention is to be limited only by the appended claims.

What is claimed is:

1. A very narrow band reliable modular production quality high repetition rate [ArF] $F_2$ excimer laser for producing a narrow band pulsed laser beam at repetition rates of at least about 1000 Hz, said laser comprising:

A. a quickly replaceable laser chamber module comprising a laser chamber comprising:

1) two elongated electrodes;

2) a laser gas comprised of a) fluorine, and b) a noble gas;

3) a gas circulator for circulating said gas between said electrodes at speeds of at least two cm/millisecond B. a modular pulse power system comprised of at least one quickly replaceable module, said system being comprised of a power supply and pulse compression and amplification circuits and pulse power controls for producing high voltage electrical pulses of at least 14,000 volts across said electrodes at rates of at least about 1000 Hz; and C. a laser pulse energy control system for controlling the voltage provided by said pulse power system, said control system comprising a laser pulse energy monitor and a computer processor programmed with an algorithm for calculating, based on historical pulse energy data, electrical pulses needed to produce laser pulses having pulse energies within a desired range of energies.

2. A laser as in claim 1 wherein said chamber, said pulse power system, said line narrowing system, said energy control system and substantially all electrical, optical and mechanical components of said laser are contained in quickly replaceable modules.

3. A laser as in claim 2 wherein said two elongated electrodes define a cathode and an anode and said anode is supported by an anode support bar having a tapered surface positioned to reduce aerodynamic reaction forces on said bearings.

4. A laser as in claim 1 wherein said chamber and said gas circulator define a gas flow path and an upstream direction and said laser also comprises a single preionizer tube located upstream of said electrodes.

5. A laser as in claim 1 wherein each of said electrodes define an electrode length and said single preionizer tube is comprised of a grounded electrically conducting rod positioned along the axis of an $Al_2O_3$ hollow cylindrical tube having a length longer than said electrode length.

6. A laser as in claim 1 wherein all of said at least three prisms are comprised of calcium fluoride.

7. A laser as in claim 1 wherein said two elongated electrodes define a cathode and an anode and said anode support bar comprises cooling fins.

8. A laser as in claim 7 herein said anode and said anode support bar together have a combined mass of at least about 3.4 kg.

9. A laser as in claim 1 wherein said two elongated electrodes define a cathode and an anode and said anode comprises cooling fins.

10. A laser as in claim 1 wherein said modular pulse power system is comprised of at least three modules which each of which are designed for quick removal and replacement.

11. A laser as in claim 1 wherein said laser chamber defines a chamber structure and wherein said two elongated electrodes define a cathode and an anode and said cathode is insulated from said chamber structure by a single piece insulator comprised of $Al_2O_3$ which is attached to a portion of said chamber structure.

12. A laser as in claim 11 wherein the portion of said chamber structure to which said single piece insulator is comprised of a material having a coefficient of thermal expansion similar to that of $Al_2O_3$.

13. A laser as in claim 12 wherein said structure material is ASTM A36 steel.

14. A laser as in claim 13 wherein said cathode is mounted directly on said single piece insulator.

15. A laser as in claim 1 wherein all seals exposed to said laser gas are metal seals.

16. A laser as in claim 1 further comprising flow vane structures comprised of monel.

17. A laser as in claim 1 and further comprising acoustic baffles.

18. A laser as in claim 1 wherein said power supply comprises a rectifier for converting AC power to DC power, an inverter for converting the DC power to high frequency AC power, a step-up transformer for increasing the voltage of said high frequency AC power to a higher voltage, a rectifier for converting the higher voltage to charge a charging capacitor to a voltage at or approximately at a command voltage established by said laser pulse energy control system.

19. A laser as in claim 18 wherein said power supply is configured to slightly over charge said charging capacitor and further comprises a bleed circuit to bleed down said charging capacitor to said command voltage.

20. A laser as in claim 19 wherein said pulse power system comprises a solid state switch which upon closing initiates said high voltage electrical pulses by allowing charge to flow from said charging capacitor to a second capacitor to create a high voltage charge on said record capacitor.

21. A laser as in claim 20 and further comprising an inductor, a pulse transformer and a third capacitor wherein said inductor, pulse transformer and said third capacitor are arranged to permit the high voltage charge on said second capacitor to flow to ground through the primary side of said pulse transformer in order to produce a very high voltage pulse at the output of said pulse transformer to be stored temporarily on said third capacitor.

22. A laser as in claim 21 wherein said primary side of said pulse transformer comprises a plurality of hollow spools, each spool defining an axis, connected in series and a secondary side of said pulse transformer is comprised of at least one rod co-aligned with the axis of a plurality of said spools.

23. A laser as in claim 22 wherein said at least one rod is four rods connected in series and defining two leads, one defining a ground lead and the other a very high voltage lead.

24. A laser as in claim 1 wherein said laser pulse power system comprises at least one saturable inductor with a coil emersed in oil contained in a pot which also serves as the high voltage lead of the inductor.

25. A laser as in claim 1 wherein said gas circulator comprises a blower comprising a shaft supported by active at least two magnetic bearings, each bearing comprising a stator and a rotor; said shaft bearing driver by a motor comprising a stator and a rotor, said blower also comprising a sealing means for sealing said rotors within an environment containing said laser gas with said stator outside said laser gas environment.

26. A laser as in claim 1 wherein said gas circulator comprises a blower comprising a shaft supported by at least two ceramic bearings.

27. A laser as in claim 1 and further comprising an $N_2$ purge system providing an $N_2$ purge flow to all laser optical components outside the laser chamber wherein said purge flow is contained at a pressure of less than 10 pascals.

28. A laser as in claim 1 and further comprising a means of measuring the rate of change of pulse energy with changing voltage $\Delta E/\Delta V$, and a computer controller programmed with an algorithm for controlling pulse energy and integrated energy dose in a burst of pulses defining present burst pulses, $P_1, P_2 \ldots P_N \ldots P_k$. $P_{k+1}, P_{k+2} \ldots P_{K+N} \ldots P_1$. $P_2 \ldots P_{N-1}, P_N$, from said laser having a pulse power system including a high voltage charging system defining a charging voltage, said algorithm comprising the steps of:

A) measuring the energy in each pulse of said burst of pulses,

B) determining a rate of change of pulse energy with charging voltage, $\Delta E/\Delta V$, C) controlling the pulse energy of each pulse $P_N$ in the first K pulses, in said burst of pulses by regulating the charging voltage of the laser utilizing a computer processor programmed with a first algorithm which:

(1) determines for each $P_N$ a pulse energy error, $\epsilon$, based on a measured energy of at least one previous pulse in said burst and a predetermined target pulse energy value, (2) determines for each $P_N$ an integrated dose error, D, of all previous pulses $P_1$ through $P_{N-1}$ in said burst, (3) determines a charging voltage $V_N$, for each of said pulses, $P_N$, in said first plurality of pulses using:

(i) said $\Delta E/\Delta V$ (ii) said $\epsilon$ (iii) said D (iv) a reference voltage based on specified voltages for PN in a plurality of previous bursts, D) controlling the pulse energy of each pulse $P_{K+N}$, in pulses following $P_K$ in said burst of pulses by regulating the charging voltage of the laser utilizing a computer processor programmed with a second algorithm which:

(1) determines for each $P_N$ a pulse energy error, $\epsilon$, based on a measured energy of at least one previous pulse in said burst and a predetermined target pulse energy value, (2) determines for each $P_N$ an integrated dose error, D, of all previous pulses, $P_1$ through $P_{N-1}$ in said burst, (3) determines a charging voltage, $V_N$, for each of said pulses, $P_N$ in said first plurality of pulses using:

(i) said $\Delta E/\Delta V$ (ii) said $\epsilon$ (iii) said D (iv) a reference voltage based on specified voltages for $P_N$ in a plurality of previous bursts, wherein said $V_N$'s in said fast and second algorithms are functions of at least said $\Delta E/\Delta V$, said $\epsilon$, said D and said at least one reference voltage and said $V_N$'s when calculated one utilized to adjust said charging voltage to control both the individual pulse energy and the integrated energy dose to desired values.

29. A laser as in claim 1 and further comprising an anode support means comprising a tapered surface for reducing the magnitude of aerodynamic reaction forces resulting from laser gas exiting said blower and being redirected by said anode support means.

30. A laser as in claim 1 and further comprising a fluorine injection system comprising a processor programmed with an algorithm designed to cause fluorine to be injected continuously or at intervals of less than 30 minutes in order to maintain fluorine concentration substantially constant at a desired concentration over extended time periods of at least several days.

31. A laser as in claim 30 wherein said fluorine injection system and further comprising a feedback providing to said processor a voltage signal representative of laser discharge voltages which signal is used by said processor to maintain said signal within a predetermined range.

32. A laser as in claim 31 wherein said predetermined range is revised periodically in order to keep the laser operating with a fluorine concentration within a desired range.

33. A laser as in claim 32 further comprising a means for periodically determining a laser parameter representative of a temporal pulse width of the laser pulses.

34. A laser as in claim 30 wherein said determined parameter is the integral square pulse width.

35. A reliable modular production quality high repetition rate excimer laser for producing a narrow band pulsed laser beam at a repetition rate of at least about 1Khz, said laser comprising:

A. a quickly replaceable laser chamber module comprising:

1) two elongated electrodes 2) a laser gas comprised of fluorine and a buffer gas, 3) a gas circulator system for circulating said laser gas between said electrodes at at least two cm/millisecond comprising:

a) a braze-free blade structure defining a shaft, b) a brushless motor for rotating said shaft, c) magnetic bearings for supporting said shaft said motor and said bearings having rotors attached to said shaft and sealed within an environment exposed to said laser gas and said motor and said bearings having a stator outside of said laser gas environment.

B. a pulse power system substantially contained within at least one quickly replaceable module and comprising:

1) a processor controlled high voltage power supply for periodically, at rates of at least about 1000 Hz, charging with electrical energy a charging capacitor to a predetermined pulse control voltage, 2) a compression and amplification circuit for connecting electrical energy stored on said charging capacitor into a high voltage electrical pulses of at least 14,000 volts across said electrodes.

36. A laser as in claim 35 wherein said chamber and said gas circulator define a gas flow path and an upstream direction and said laser also comprises a single preionizer tube located upstream of said electrode and wherein each of said electrodes define an electrode length and said single preionizer tube is comprised of a grounded electrically conducting rod positioned along the axis of an $Al_2O_3$ hollow cylindrical tube having a length longer than said electrode length.

37. A laser as in claim 35 and further comprising a means of measuring the rate of change of pulse energy with changing voltage $\Delta E/\Delta V$, and a computer controller programmed with an algorithm for controlling pulse energy and integrated energy dose in a burst of pulses defining present burst pulses, $P_1, P_2 \ldots P_N \ldots P_k, P_{K+1}, P_{K+2} \ldots P_{K+n}, \ldots P_1, P_2 \ldots P_{N-1}, P_N$, from said laser having a pulse power system including a high voltage charging system defining a charging voltage, said algorithm comprising the steps of:

A) measuring the energy in each pulse of said burst of pulses,

B) determining a rate of change of pulse energy with charging voltage, $\Delta E/\Delta V$, C) controlling the pulse energy of each pulse $P_N$ in the first K pulses, in said burst of pulses by regulating the charging voltage of the laser utilizing a computer processor programmed with a first algorithm which:

(1) determines for each $P_N$ a pulse energy error, $\epsilon$, based on a measured energy of at least one previous pulse in said burst and a predetermined target pulse energy value, (2) determines for each $P_N$ an integrated dose error, D, of all previous pulses $P_1$ through $P_{N-1}$ in said burst.

(3) determines a charging voltage $V_N$, for each of said pulses, $P_N$, in said first plurality of pulses using:

(i) said $\Delta E/\Delta V$ (ii) said $\epsilon$ (iii) said D (v) a reference voltage base on specified voltages for PN in a plurality of previous bursts, D) controlling the pulse energy of each pulse $P_{K+N}$, in pulses following $P_K$ in said burst of pulses by regulating the charging voltage of the laser utilizing a computer processor programmed with a second algorithm which:

(1) determines for each $P_N$ a pulse energy error, $\epsilon$, based on a measured energy of at least one previous pulse in said burst and a predetermined target pulse energy value, (2) determines for each $P_N$ an integrated dose error, D, of all previous pulses $P_1$ through $P_{N-1}$ in said burst, (3) determines a charging voltage, $V_N$, for each of said pulses, $P_N$ in said first plurality of pulses using:

(i) said $\Delta E/\Delta V$ (ii) said $\epsilon$ (v) said D (vi) a reference voltage based on specified voltages for $P_N$ in a plurality of previous bursts, wherein said $V_N$'s in said first and second algorithms are functions of at least said $\Delta E/\Delta V$, said $\epsilon$, said D and said at least one reference voltage and said $V_N$'s when calculated one utilized to adjust said charging voltage to control both the individual pulse energy and the integrated energy dose to desired values.

* * * * *

UNITED STATES PATENT AND TRADEMARK OFFICE

CERTIFICATE OF CORRECTION

PATENT NO. : RE 38,054 E
APPLICATION NO. : 09/801383
DATED : April 1, 2003
INVENTOR(S) : Hofmann et al.

It is certified that error appears in the above-identified patent and that said Letters Patent is hereby corrected as shown below:

Column 26, Claim 20:
Line 16, change “record” to --second--.

Signed and Sealed this

Fifteenth Day of August, 2006

JON W. DUDAS
*Director of the United States Patent and Trademark Office*